(12) United States Patent
Sagawai et al.

(10) Patent No.: US 10,761,666 B2
(45) Date of Patent: Sep. 1, 2020

(54) INPUT DEVICE, ELEMENT DATA GENERATION METHOD, AND STORAGE MEDIUM

(71) Applicant: ALPS ALPINE CO., LTD., Tokyo (JP)

(72) Inventors: Shinichi Sagawai, Miyagi (JP); Tomoki Yamada, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/282,570

(22) Filed: Feb. 22, 2019

(65) Prior Publication Data

US 2019/0187838 A1 Jun. 20, 2019

Related U.S. Application Data

(63) Continuation of application No. PCT/JP2017/008464, filed on Mar. 3, 2017.

(30) Foreign Application Priority Data

Sep. 5, 2016 (JP) .................. 2016-173084

(51) Int. Cl.
*G06F 3/044* (2006.01)
*G06F 3/0354* (2013.01)
*G06F 3/041* (2006.01)
*H03K 17/955* (2006.01)

(52) U.S. Cl.
CPC ............ *G06F 3/044* (2013.01); *G06F 3/0354* (2013.01); *G06F 3/03547* (2013.01); *G06F 3/041* (2013.01); *H03K 17/955* (2013.01)

(58) Field of Classification Search
CPC ........ G06F 3/041; G06F 3/044; G06F 3/0354; G06F 3/03547; H03K 17/955

USPC .......................................................... 345/173
See application file for complete search history.

(56) References Cited

U.S. PATENT DOCUMENTS

| | | | |
|---|---|---|---|
| 9,360,512 B2 | 6/2016 | Luong | |
| 9,658,723 B2 * | 5/2017 | Guarneri | ................. G06F 3/044 |
| 9,841,859 B2 * | 12/2017 | Besshi | ................. G06F 3/0338 |
| 9,946,397 B2 * | 4/2018 | Dorfner | ................. G06F 3/0416 |
| 9,965,099 B2 | 5/2018 | Yamada | |

(Continued)

FOREIGN PATENT DOCUMENTS

| | | |
|---|---|---|
| JP | 2015-510210 | 4/2015 |
| WO | 2016/021356 | 2/2016 |

OTHER PUBLICATIONS

International Search Report dated May 16, 2017 in PCT/JP2017/008464 filed on Mar. 3, 2017.

*Primary Examiner* — Jason M Mandeville
(74) *Attorney, Agent, or Firm* — IPUSA, PLLC

(57) ABSTRACT

An input device includes a sensor that detects a degree of proximity of an object in each of one or more detection regions on an operation surface, generates one or more sets of detection data corresponding to the detection result for each of the detection regions, and thereby generates N sets of the detection data in total; and an element data generator that generates, based on the N sets of the detection data, M (M is a natural number greater than N) sets of element data indicating degrees of proximity of the object in M sections that virtually divide the operation surface. The element data generator is configured to repeat a data generation process at least two times.

13 Claims, 20 Drawing Sheets

(56) References Cited

U.S. PATENT DOCUMENTS

| | | | |
|---|---|---|---|
| 10,083,287 B2* | 9/2018 | Kwon | G06F 21/83 |
| 2015/0002461 A1* | 1/2015 | Guarneri | G06F 3/044 |
| | | | 345/174 |
| 2016/0170530 A1* | 6/2016 | Lee | G06F 3/044 |
| | | | 345/174 |
| 2016/0209956 A1* | 7/2016 | Besshi | G06F 3/0354 |
| 2016/0364074 A1* | 12/2016 | Dorfner | G06F 3/044 |
| 2017/0061108 A1* | 3/2017 | Kwon | G06F 21/32 |
| 2020/0026409 A1* | 1/2020 | Sagawai | G06F 3/0446 |
| 2020/0192527 A1* | 6/2020 | Matsuda | G06F 3/041 |

* cited by examiner

FIG.3

$$P_1 = P_2 \cdots P_j \cdots P_M$$

$$S_1 = U_{11} + U_{12} + \cdots + U_{1j} + \cdots + U_{1M}$$
$$+ \quad + \quad + \quad +$$
$$S_2 = U_{21} + U_{22} + \cdots + U_{2j} + \cdots + U_{2M}$$
$$+ \quad + \quad + \quad +$$
$$\vdots \quad \vdots \quad \vdots \quad \vdots \quad \vdots$$
$$+ \quad + \quad + \quad +$$
$$S_i = U_{i1} + U_{i2} + \cdots + U_{ij} + \cdots + U_{iM}$$
$$+ \quad + \quad + \quad +$$
$$\vdots \quad \vdots \quad \vdots \quad \vdots \quad \vdots$$
$$+ \quad + \quad + \quad +$$
$$S_N = U_{N1} + U_{N2} + \cdots + U_{Nj} + \cdots + U_{NM}$$

FIG.4

$$S_1 = P_1 \times K_{11} + P_2 \times K_{12} + \cdots + P_j \times K_{1j} + \cdots + P_M \times K_{1M}$$

$$S_2 = P_1 \times K_{21} + P_2 \times K_{22} + \cdots + P_j \times K_{2j} + \cdots + P_M \times K_{2M}$$

$$\vdots$$

$$S_i = P_1 \times K_{i1} + P_2 \times K_{i2} + \cdots + P_j \times K_{ij} + \cdots + P_M \times K_{iM}$$

$$\vdots$$

$$S_N = P_1 \times K_{N1} + P_2 \times K_{N2} + \cdots + P_j \times K_{Nj} + \cdots + P_M \times K_{NM}$$

FIG.5

$$SA_1 = PA_1 \times K_{11} + PA_2 \times K_{12} + \cdots + PA_j \times K_{1j} + \cdots + PA_M \times K_{1M}$$
$$+ \quad\quad + \quad\quad + \quad\quad +$$
$$SA_2 = PA_1 \times K_{21} + PA_2 \times K_{22} + \cdots + PA_j \times K_{2j} + \cdots + PA_M \times K_{2M}$$
$$+ \quad\quad + \quad\quad + \quad\quad +$$
$$\vdots$$
$$+ \quad\quad + \quad\quad + \quad\quad +$$
$$SA_i = PA_1 \times K_{i1} + PA_2 \times K_{i2} + \cdots + PA_j \times K_{ij} + \cdots + PA_M \times K_{iM}$$
$$+ \quad\quad + \quad\quad + \quad\quad +$$
$$\vdots$$
$$+ \quad\quad + \quad\quad + \quad\quad +$$
$$SA_N = PA_1 \times K_{N1} + PA_2 \times K_{N2} + \cdots + PA_j \times K_{Nj} + \cdots + PA_M \times K_{NM}$$
$$\| \quad\quad \| \quad\quad \| \quad\quad \|$$
$$PA_1 \quad PA_2 \quad \cdots \quad PA_j \quad \cdots \quad PA_M$$

INPUT DEVICE, ELEMENT DATA GENERATION METHOD, AND STORAGE MEDIUM

CROSS-REFERENCE TO RELATED APPLICATIONS

The present application is a continuation application filed under 35 U.S.C. 111(a) claiming benefit under 35 U.S.C. 120 and 365(c) of PCT International Application No. PCT/JP2017/008464, filed on Mar. 3, 2017, which is based on and claims priority to Japanese Patent Application No. 2016-173084 filed on Sep. 5, 2016, the entire contents of which are incorporated herein by reference.

BACKGROUND OF THE INVENTION

1. Field of the Invention

An aspect of this disclosure relates to an input device, an element data generation method, and a storage medium.

2. Description of the Related Art

In an input device such as a touch pad or a touch panel that identifies a contact position of a finger based on a change in capacitance and inputs information in the identified contact position, an image sensing method that can simultaneously detect multiple contact positions is typically used.

Methods for detecting changes in capacitance include a mutual-capacitance method where changes in capacitance between two electrodes are detected and a self-capacitance method where capacitance between an electrode and a ground is detected. To implement, for example, a hovering function for detecting an operation performed by a finger located apart from an operation surface, a self-capacitance sensor having high capacitance sensitivity is preferably used.

However, because a typical self-capacitance sensor uses one electrode to detect capacitance at one location, if a self-capacitance sensor is applied to an image sensing method, the number of electrodes drastically increases as the resolution increases. In view of this problem, WO 2016/021356 discloses an input device where capacitance data (element data) for each of multiple sections defined on an operation surface is generated based on capacitance data (detection data) detected using electrodes whose number is smaller than the number of the sections.

In the input device described in WO 2016/021356, a data generation process is repeated to generate m (m>n) sets of element data based on n sets of detection data. In each data generation process, tentative detection data is calculated based on tentative element data, and the tentative element data is corrected based on a comparison between the tentative detection data and actual detection data. As the repeat count of the data generation process increases, the accuracy of generated element data increases. However, to reduce the computational load, it is preferable to reduce the repeat count of the data generation process.

SUMMARY OF THE INVENTION

In an aspect of this disclosure, there is provided an input device that inputs information corresponding to proximity of an object to an operation surface. The input device includes a sensor that detects a degree of proximity of the object in each of one or more detection regions on the operation surface, generates one or more sets of detection data corresponding to the detection result for each of the detection regions, and thereby generates N sets of the detection data in total; and an element data generator that generates, based on the N sets of the detection data, M (M is a natural number greater than N) sets of element data indicating degrees of proximity of the object in M sections that virtually divide the operation surface. Each of the M sections includes overlapping portions overlapping one or more of the detection regions, each of the M sets of the element data is a sum of sets of subelement data distributed to the N sets of the detection data according to predetermined percentages, and each of the N sets of the detection data approximates to a sum of sets of the subelement data distributed from the M sets of the element data according to the predetermined percentages. The element data generator is configured to repeat a data generation process at least two times, the data generation process including calculating each of tentative values of the N sets of the detection data by totaling the sets of the subelement data distributed from tentative values of the M sets of the element data according to the predetermined percentages, and correcting the tentative values of the M sets of the element data based on N predetermined percentages set for each of the M sets of the element data such that the calculated tentative values of the N sets of the detection data become closer to the N sets of the detection data, and calculate, for each of the M sections, a value that is approximate to a convergence value of the element data obtained by the repetition of the data generation process, by obtaining a difference between a first tentative value of the element data obtained in a first execution of the data generation process and a second tentative value of the element data obtained in a second execution of the data generation process, multiplying the difference by a predetermined proportionality coefficient, and adding the multiplied difference to the first tentative value.

BRIEF DESCRIPTION OF THE DRAWINGS

FIG. 3 is a drawing illustrating a relationship between N sets of detection data and M sets of subelement data;

FIG. 4 is a drawing illustrating conversion of M sets of element data into N sets of detection data;

FIG. 5 is a drawing illustrating conversion of tentative values of M sets of element data into tentative values of N sets of detection data;

DESCRIPTION OF THE PREFERRED EMBODIMENTS

An aspect of this disclosure provides an input device, an element data generation method, and a storage medium that can generate element data indicating the degree of proximity of an object to each of multiple sections on an operation surface by simple calculations based on sets of detection data whose number is smaller than the number of the sections.

Embodiments of the present invention are described below with reference to the accompanying drawings.

First Embodiment

Figure 1:
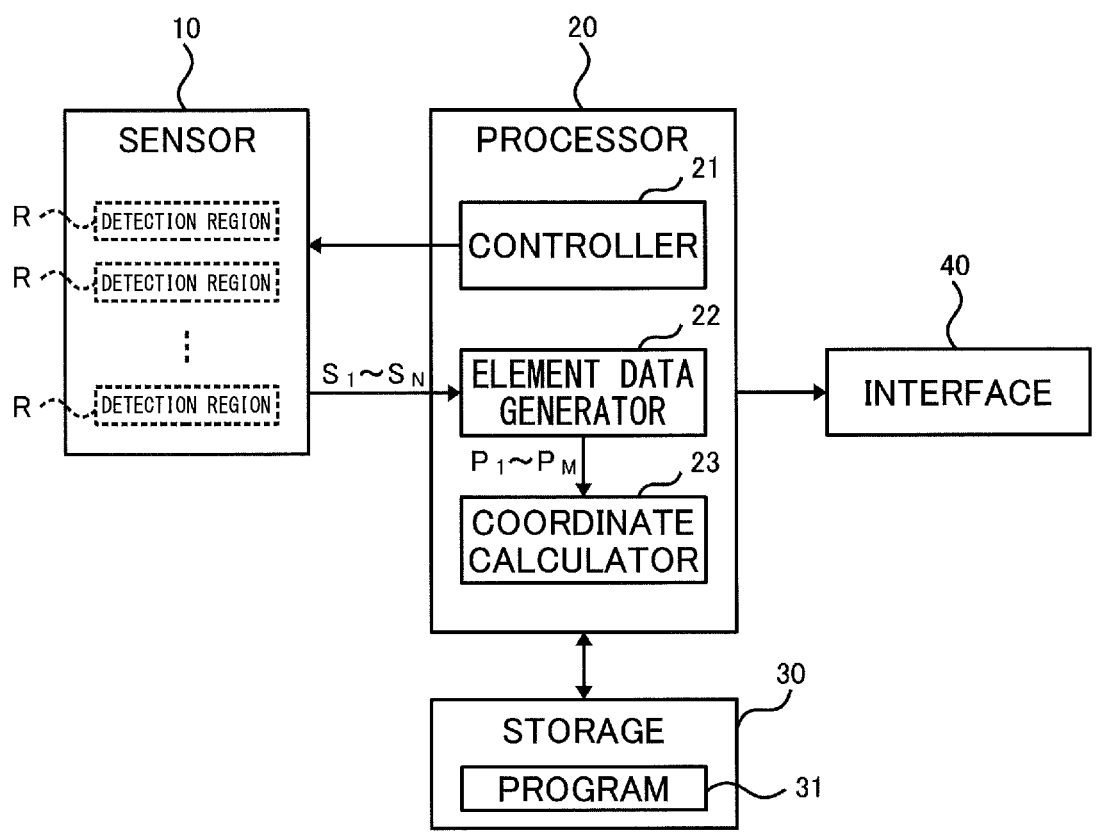
FIG. 1 is a drawing illustrating an example of a configuration of an input device according to a first embodiment.

FIG. 1 is a drawing illustrating an example of a configuration of an input device according to a first embodiment of the present invention.

The input device illustrated in FIG. 1 includes a sensor 10, a processor 20, a storage 30, and an interface 40. The input device of the present embodiment inputs information corresponding to a position on an operation surface provided with a sensor to which an object such as a finger or a pen is brought into proximity. In the present application, "proximity" indicates that an object is located near an operation surface and does not indicate whether the object is in contact with the operation surface.

<Sensor 10>

The sensor 10 detects the degree of proximity of an object (such as a finger or a pen) to each of one or more detection regions R on an operation surface 11, and generates N sets of detection data $S_1$ through $S_N$ in total. The sensor 10 generates one or more sets of detection data $S_i$ for the respective detection regions R. Here, "i" indicates an integer between 1 and N. In the descriptions below, the N sets of detection data $S_1$ through $S_N$ may be referred to as "detection data S" when distinction is not necessary.

For example, the sensor 10 detects capacitance between an electrode disposed in a detection region R and an object, and generates the detected capacitance as detection data $S_i$. The sensor 10 may also be configured to detect the degree of proximity to the detection region R based on a physical quantity other than capacitance (e.g., a resistance change corresponding to a contact pressure).

Figure 2A:
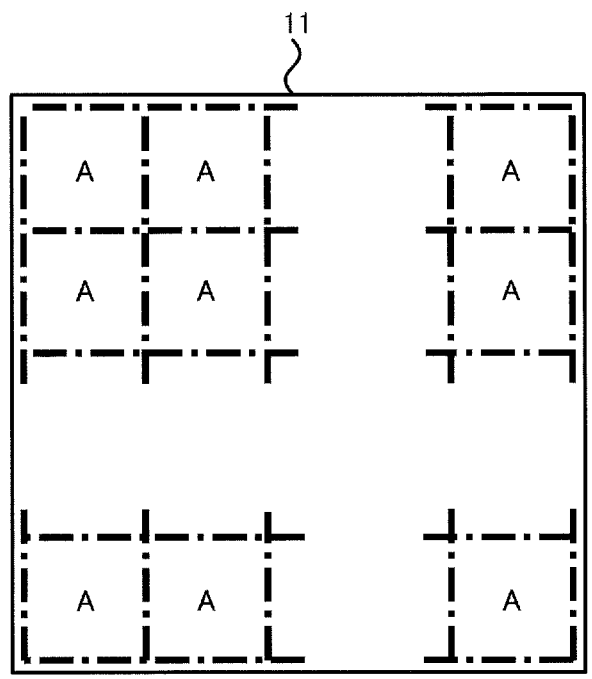
FIG. 2A is a drawing illustrating multiple sections obtained by virtually dividing an operation surface.
Figure 2B:
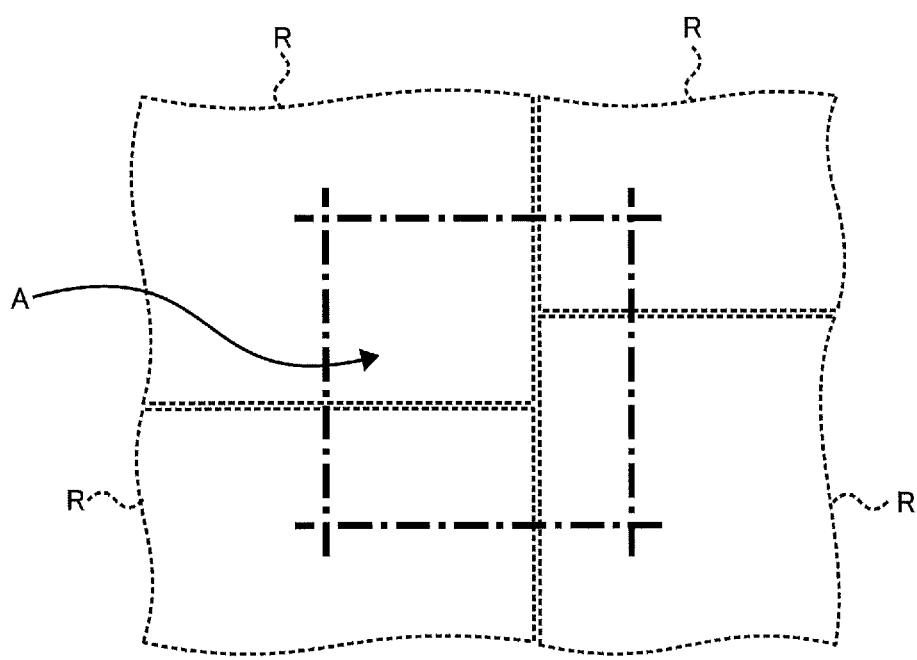
FIG. 2B is a drawing illustrating overlaps between a section and detection regions.

As illustrated in FIG. 2A, the operation surface 11 of the sensor 10 is virtually divided into multiple sections A. In the example of FIG. 2A, the sections A form a grid. Each of the sections A overlaps one or more detection regions R. In the example of FIG. 2B, each section A overlaps four detection regions R. Accordingly, the sensor 10 generates one or more sets of detection data S indicating the degree of proximity of an object for each of the sections A. In the descriptions below, it is assumed that the number of sections A is M that is greater than N (M>N). Also, each of the sections A may be referred to as "section $A_j$" for identification. Here, "j" indicates an integer between 1 and M.

Based on N sets of detection data $S_1$ through $S_N$, the input device of the present embodiment generates M sets of element data $P_1$ through $P_M$ that indicate the degrees of proximity of an object in the corresponding M sections $A_1$ through $A_M$. In the descriptions below, the M sets of element data $P_1$ through $P_M$ may be referred to as "element data P" when distinction is not necessary.

A certain relationship exists between M sets of element data $P_1$ through $P_M$ and N sets of detection data $S_1$ through $S_N$. That is, each of M sets of element data $P_1$ through $P_M$ is represented by a sum of sets of subelement data U that are distributed to N sets of detection data $S_1$ through $S_N$ according to predetermined percentages. When "$U_{ij}$" indicates subelement data U distributed from element data $P_j$ to detection data $S_i$, element data $P_j$ is represented by formula (1) below.

[Formula 1]

$$P_j = \sum_{i=1}^{N} U_{ij} \quad (1)$$

Each of N sets of detection data $S_1$ through $S_N$ approximates a sum of sets of subelement data $U_{ij}$ that are distributed from M sets of element data $P_1$ through $P_M$ according to predetermined percentages. Detection data Si is represented by formula (2) below.

[Formula 2]

$$S_i = \sum_{j=1}^{M} U_{ij} \quad (2)$$

FIG. 3 is a drawing illustrating a relationship between N sets of detection data $S_1$ through $S_N$ and M sets of element data $P_1$ through $P_M$, i.e., the relationship between formulas (1) and (2). As illustrated in FIG. 3, the detection data $S_i$ approximates a value obtained by totaling subelement data $U_{i1}$ through $U_{iM}$ distributed from each of N sets of detection data $S_1$ through $S_N$. Therefore, if subelement data $U_{i1}$ through $U_{iM}$ can be calculated from element data $P_1$ through $P_M$, detection data $S_i$ can also be calculated using formula (2).

In the input device of the present embodiment, it is assumed that the percentage of subelement data $Ui_j$ in one set of element data $P_j$ distributed to one set of detection data $S_i$ is constant. When "constant data $K_{ij}$" indicates this percentage, constant data $K_{ij}$ is represented by formula (3) below.

[Formula 3]

$$K_{ij} = \frac{U_{ij}}{P_j} \quad (3)$$

When subelement data $U_{ij}$ derived from formula (3) is substituted in formula (2), detection data $S_i$ is represented by formula (4) below.

[Formula 4]

$$S_i = \sum_{j=1}^{M} K_{ij} P_j \quad (4)$$

FIG. 4 is a drawing illustrating conversion of M sets of element data $P_1$ through $P_M$ into N sets of detection data $S_1$ through $S_N$. Conversion of M sets of element data $P_1$ through $P_M$ into N sets of detection data $S_1$ through $S_N$ represented by formula (4) is defined by N×M sets of constant data $K_{ij}$. As is also apparent from FIG. 4, this conversion can be expressed by formula (5) below using matrices.

[Formula 5]

$$\underbrace{\begin{bmatrix} K_{11} & K_{12} & \cdots & K_{1M} \\ K_{21} & & & K_{2M} \\ \vdots & & & \vdots \\ K_{N1} & K_{N2} & \cdots & K_{NM} \end{bmatrix}}_{K} \begin{bmatrix} P_1 \\ P_2 \\ \vdots \\ P_M \end{bmatrix} = \begin{bmatrix} S_1 \\ S_2 \\ \vdots \\ S_N \end{bmatrix} \quad (5)$$

The N×M matrix (first conversion matrix K) on the left-hand side of formula (5) is known data that is determined by the configuration of the sensor 10 such as the manner in which detection regions R and sections A of the sensor 10 overlap each other and the sensitivities of portions of each detection region R overlapping the sections A.

<Processor 20>

The processor 20 is a circuit that controls the operations of the entire input device, and may include, for example, a computer that executes processes according to instruction codes of a program 31 stored in the storage 30 and/or a logic circuit that implements a specific function. All of processes performed by the processor 20 may be implemented by executing programs with a computer, or some or all of the processes may be implemented by dedicated logic circuits.

In the example of FIG. 1, the processor 20 includes a controller 21, an element data generator 22, and a coordinate calculator 23.

The controller 21 controls the timing of detection by the sensor 10. For example, the controller 21 controls internal circuits of the sensor 10 so that the selection of detection regions R used for detection, the sampling of an analog signal obtained as a detection result, and the generation of detection data S by A/D conversion are performed at appropriate timings.

The element data generator 22 performs a process for generating M sets of element data $P_1$ through $P_M$ corresponding to M sections A based on N sets of detection data generated by the sensor 10.

The element data generator 22 may be configured to repeat a data generation process described below a large number of times so that M sets of element data $P_1$ through $P_M$ converge on certain values. However, to simplify calculations, the element data generator 22 is configured to perform the data generation process two times. Based on tentative values $PA_1$ through $PA_M$ of M sets of element data obtained in each of two data generation processes, the element data generator 22 obtains M sets of element data $P_1$ through $P_M$ (final values) through comparatively simple calculations.

First, the data generation process is described.

In each data generation process, the element data generator 22 calculates tentative values $SA_1$ through $SA_N$ of N sets of detection data each of which is a sum of sets of subelement data $U_{ij}$ that are distributed from tentative values $PA_1$ through $PA_M$ of M sets of element data according to predetermined percentages (constant data $K_{ij}$). Then, the element data generator 22 corrects the tentative values $PA_1$ through $PA_M$ of M sets of element data based on N×M sets of constant data $K_{ij}$ such that the calculated tentative values $SA_1$ through $SA_N$ of N sets of detection data become closer to N sets of detection data $S_1$ through $S_N$ detected by the sensor 10.

Specifically, this data generation process includes four processes (first through fourth processes).

<First Process>

In the first process, the element data generator 22 converts tentative values $PA_1$ through $PA_M$ of M sets of element data into tentative values $SA_1$ through $SA_N$ of N sets of detection data based on N×M sets of constant data $K_{ij}$ that are known data. Based on the relationship expressed by formula (5), this conversion can be expressed by formula (6) below using the first conversion matrix K.

[Formula 6]

$$\underbrace{\begin{bmatrix} K_{11} & K_{12} & \cdots & K_{1M} \\ K_{21} & & & K_{2M} \\ \vdots & & & \vdots \\ K_{N1} & K_{N2} & \cdots & K_{NM} \end{bmatrix}}_{K} \begin{bmatrix} PA_1 \\ PA_2 \\ \vdots \\ PA_M \end{bmatrix} = \begin{bmatrix} SA_1 \\ SA_2 \\ \vdots \\ SA_N \end{bmatrix} \quad (6)$$

FIG. 5 is a drawing illustrating conversion of tentative values $PA_1$ through $PA_N$ of M sets of element data into tentative values $SA_1$ through $SA_N$ of N sets of detection data. Because the first conversion matrix K is known data, when tentative values $PA_1$ through $PA_M$ of M sets of element data are given, tentative values $SA_1$ through $SA_N$ of N sets of detection data can be calculated using formula (6).

<Second Process>

In the second process, the element data generator 22 calculates N first coefficients $\alpha_1$ through $\alpha_N$ used to multiply tentative values $SA_1$ through $SA_N$ of N sets of detection data to make the tentative values $SA_1$ through $SA_N$ of N sets of detection data equal to N sets of detection data $S_1$ through $S_N$. A first coefficient $\alpha_i$ is represented by formula (7) below.

[Formula 7]

$$\alpha_i = \frac{S_i}{SA_i} \quad (7)$$

The calculation of first coefficients $\alpha_1$ through $\alpha_N$ is represented by formula (8) using matrices.

[Formula 8]

$$\begin{bmatrix} \alpha_1 \\ \alpha_2 \\ \vdots \\ \alpha_N \end{bmatrix} = \begin{bmatrix} S_1/SA_1 \\ S_2/SA_2 \\ \vdots \\ S_n/SA_N \end{bmatrix} \quad (8)$$

<Third Process>

In the third process, the element data generator 22 calculates M second coefficients $\beta_1$ through $\beta_M$ used to multiply the tentative values $PA_1$ through $PA_M$ of M sets of element data. That is, the element data generator 22 converts N first coefficients $\alpha_1$ through $\alpha_N$ into M second coefficients $\beta_1$ through $\beta_M$ based on N×M sets of constant data $K_{ij}$.

As indicated by formula (3), subelement data $U_{ij}$ distributed from element data $P_j$ to detection data $S_i$ corresponds to a percentage of element data $P_j$ indicated by constant data $K_{ij}$. As the constant data $K_{ij}$ increases, the correlation between the element data $P_j$ and the detection data $S_i$ becomes higher. Accordingly, it is assumed that the correlation between the first coefficient $\alpha_i$ and the second coefficient $\beta_j$ becomes higher as the constant data $K_{ij}$ increases. For this reason, when calculating the second coefficient $\beta_j$, the element data generator 22 averages the N first coefficients $\alpha_1$ through $\alpha_N$ weighed by the constant data $K_{ij}$ instead of simply averaging the N first coefficients $\alpha_1$ through $\alpha_N$. That is, the second coefficient $\beta_j$ is represented by formula (9) below.

[Formula 9]

$$\beta_j = \sum_{i=1}^{N} K_{ij} \alpha_i \quad (9)$$

Figure 6:
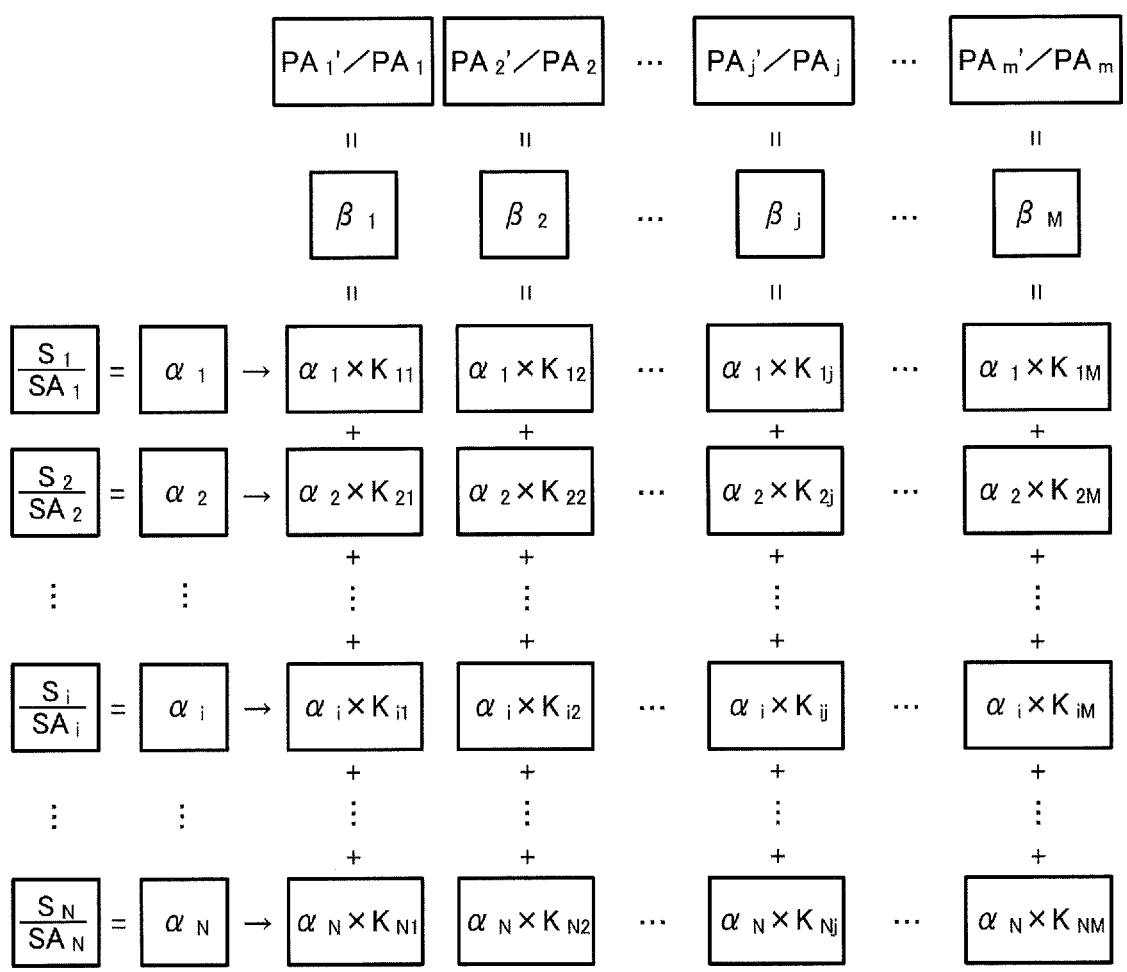
FIG. 6 is a drawing illustrating conversion of N first coefficients into M second coefficients.

FIG. 6 is a drawing illustrating conversion of N first coefficients $\alpha_1$ through $\alpha_N$ into M second coefficients $\beta_1$ through $\beta_M$. As is also apparent from FIG. 6, the relationship of formula (9) can be expressed by formula (10) using matrices.

[Formula 10]

$$\underbrace{\begin{bmatrix} K_{11} & K_{21} & \cdots & K_{N1} \\ K_{21} & & & K_{N2} \\ \vdots & & & \vdots \\ K_{1M} & K_{2M} & \cdots & K_{NM} \end{bmatrix}}_{K^T} \begin{bmatrix} \alpha_1 \\ \alpha_2 \\ \vdots \\ \alpha_N \end{bmatrix} = \begin{bmatrix} \beta_1 \\ \beta_2 \\ \vdots \\ \beta_M \end{bmatrix} \quad (10)$$

The M×N matrix (second conversion matrix $K^T$) on the left-hand side of formula (10) is a transposed matrix of the first conversion matrix K.

<Fourth Process>

In the fourth process, the element data generator 22 corrects the current tentative values $PA_1$ through $PA_M$ of element data into new tentative values $PA'_1$ through $PA'_M$ based on the M second coefficients $\beta_1$ through $\beta_M$ obtained in the third process.

[Formula 11]

$$PA'_j = \beta_j PA_j \quad (11)$$

The calculation of tentative values $PA'_1$ through $PA'_M$ in the fourth process is represented by formula (12) using matrices.

[Formula 12]

$$\begin{bmatrix} PA'_1 \\ PA'_2 \\ \vdots \\ PA'_M \end{bmatrix} = \begin{bmatrix} \beta_1 PA_1 \\ \beta_2 PA_2 \\ \vdots \\ \beta_M PA_M \end{bmatrix} \quad (12)$$

The element data generator 22 repeats the above-described data generation process at least two times. Then, the element data generator 22 calculates final values of the element data $P_j$ based on tentative values $PA_j$ (first tentative values) of element data obtained by the first data generation process and tentative values $PA_j$ (second tentative values) of element data obtained by the second data generation process. Specifically, the element data generator 22 calculates each final value of element data $P_j$ by multiplying a difference between a first tentative value and a second tentative value by a proportionality coefficient $\gamma$ and adding the multiplied difference to the first tentative value. The final value of element data $P_j$ is represented by formula (13) below.

[Formula 13]

$$P_j = \gamma \times (PA_j^{t=2} - PA_j^{t=1}) + PA_j^{t=1} \quad (13)$$

In formula (13), "t" indicates the sequence in which the data generation process is repeated. Also, "$PA_j^{t=1}$" indicates a tentative value $PA_j$ (first tentative value) of element data obtained by the first data generation process, and "$PA_j^{t=2}$" indicates a tentative value $PA_j$ (second tentative value) of element data obtained by the second data generation process.

As is described later with reference to FIG. 9, the difference between the first tentative value and the convergence value of element data obtained by repeating the data generation process tends to be proportional to the difference between the first tentative value and the second tentative value. Accordingly, the sum of the first tentative value and a value obtained by multiplying a difference between the first tentative value and the second tentative value by the proportionality coefficient γ approximates the convergence value of element data obtained by repeating the data generation process. The element data generator 22 calculates the final value of element data $P_j$ for each of M sections $A_1$ through $A_M$ according to formula (13).

Here, when "q" and "r" indicate appropriate positive integers and satisfy "q<r", "t=1" and "t=2" in formula (13) may be replaced with "t=q" and "t=r", respectively. That is, the element data generator 22 can also calculate the final value of element data $P_j$ based on a first tentative value $PA_j^{t=q}$ obtained by the q-th data generation process and a second tentative value $PA_j^{t=r}$ obtained by the r-th data generation process performed after the q-th data generation process.

The element data generator 22 is described above.

The coordinate calculator 23 calculates coordinates on the operation surface 11 to which an object (e.g., a finger or a pen) is brought into proximity based on the element data $P_1$ through $P_M$ generated by the element data generator 22. For example, the coordinate calculator 23 binarizes two-dimensional data indicated by the element data $P_1$ through $P_M$ and identifies a region where data indicating the proximity of an object gathers, as a proximity region of the object. Then, the coordinate calculator 23 generates profile data for each of the lateral direction and the longitudinal direction of the identified region. The lateral-direction profile data is obtained by calculating a sum of sets of element data $P_j$ for each column in the longitudinal direction of the operation surface 11, and arranging the sums of element data $P_j$ in the lateral direction of the operation surface 11 in sequence. The longitudinal-direction profile data is obtained by calculating a sum of sets of element data $P_j$ for each row in the lateral direction of the operation surface 11, and arranging the sums of element data $P_j$ in the longitudinal direction of the operation surface 11 in sequence. The coordinate calculator 23 calculates a peak position or a centroid position of element data $P_j$ for each of the lateral-direction profile data and the longitudinal-direction profile data. The calculated position in the lateral direction and the calculated position in the longitudinal direction indicate coordinates on the operation surface to which the object is brought into proximity. The coordinate calculator 23 stores the data of coordinates obtained by the above calculations in a predetermined storage area in the storage 30.

<Storage 30>

The storage 30 stores constant data and variable data used in processes performed by the processor 20. When the processor 20 includes a computer, the storage 30 may store the program 31 executed by the computer. The storage 30 may be implemented by, for example, one or more of a volatile memory such as a DRAM or an SRAM, a non-volatile memory such as a flash memory, and a hard disk.

<Interface 40>

The interface 40 is a circuit for exchanging data between the input device and a control device (e.g., a control IC of an information apparatus on which the input device is mounted). The processor 20 outputs information (e.g., coordinate information of objects and the number of objects) stored in the storage 30 via the interface 40 to a control device (not shown). The interface 40 may be configured to obtain the program 31 to be executed by the computer of the processor 20 from a non-temporary storage medium such as a USB memory or a server on a network, and load the program 31 into the storage 30.

A process of obtaining the proportionality coefficient γ used to calculate convergence values of element data (formula (13)) is described with reference to FIG. 7.

ST200:

The processor 20 obtains N sets of detection data $S_1$ through $S_N$ generated by the sensor 10.

ST205:

The processor 20 obtains initial values of tentative values $PA_1$ through $PA_M$ of element data used in the first execution of a data generation process (ST215) in a loop. For example, the element data generator 22 obtains, as the initial values, constant data that is stored beforehand in the storage 30.

ST210:

The processor 20 sets a variable t indicating a repetition count of the data generation process (ST215) to an initial value "0".

ST215:

The processor 20 performs the data generation process including four processes (first through fourth processes).

In the first process (ST220), based on the tentative values $PA_1$ through $PA_M$ of M sets of element data and the first conversion matrix K, the processor 20 calculates tentative values $SA_1$ through $SA_N$ of N sets of detection data according to formula (6).

In the second process (ST225), the processor 20 calculates N first coefficients $\alpha_1$ through $\alpha_N$ based on the tentative values $SA_1$ through $SA_N$ of N sets of detection data and the N sets of detection data $S_1$ through $S_N$ according to formula (8).

In the third process (ST230), the processor 20 calculates M second coefficients $\beta_1$ through $\beta_M$ based on the N first coefficients $\alpha_1$ through $\alpha_N$ and the second conversion matrix $K^T$ according to formula (10).

In the fourth process (ST235), the processor 20 corrects the tentative values $PA_1$ through $PA_M$ of M sets of element data according to formula (12) using the second coefficients $\beta_1$ through $\beta_M$.

ST240:

The processor 20 increments the variable t by "1" each time the data generation process (ST215) is performed.

ST245:

If the variable t indicating the repetition count of the data generation process (ST215) has not reached "L", the processor 20 repeats the data generation process (ST215); and if the variable t has reached "L", the processor 20 proceeds to the next step ST250.

ST250:

The processor 20 calculates each proportionality coefficient $\gamma_j$ according to formula (14) based on tentative values $PA_j$ of element data obtained by repeating the data generation process (ST215).

[Formula 14]

$$\gamma_j = \frac{(PA_j^{t=L} - PA_j^{t=1})}{(PA_j^{t=2} - PA_j^{t=1})} \qquad (14)$$

In formula (14), "$PA_j^{t=L}$" indicates a tentative value $PA_j$ of element data obtained in the L-th data generation process. The repetition limit L is set at a value that is large enough to assume that "$PA_j^{t=L}$" is the convergence value of element data. As indicated by formula (14), the proportionality coefficient $\gamma_j$ indicates the ratio of a difference between tentative values $PA_j$ of element data obtained in the first and second data generation processes to a difference between tentative values $PA_j$ of element data obtained in the first and L-th data generation processes.

ST255:

The processor 20 calculates an average of M proportionality coefficients $\gamma_1$ through $\gamma_M$ obtained at step ST250, and obtains the average as the proportionality coefficient γ. The proportionality coefficient γ is represented by formula (15) below.

[Formula 15]

$$\gamma = \frac{\sum_{j=1}^{M} \gamma_j}{M} \quad (15)$$

The proportionality coefficient γ may not necessarily be calculated by the processor 20. In this case, the proportionality coefficient γ calculated beforehand by another device may be used in an element data P generation process described below.

Next, an element data P generation process performed by the input device of the present embodiment is described with reference to FIG. 8.

ST300:

The element data generator 22 obtains N sets of detection data $S_1$ through $S_N$ generated by the sensor 10.

ST305:

The element data generator 22 obtains initial values of tentative values $PA_1$ through $PA_M$ of element data to be used in the first data generation process (ST310) described below. For example, the element data generator 22 obtains, as the initial values, constant data that is stored beforehand in the storage 30.

Alternatively, the element data generator 22 may obtain, as the initial values, element data $P_1$ through $P_M$ (final values) obtained in the previous element data P generation process. Also, the element data generator 22 may calculate moving averages of respective element data based on multiple groups of element data $P_1$ through $P_M$ (final values) obtained in most-recent element data P generation processes, and obtain the moving averages as the initial values for the current element data P generation process. Compared with a case where initial values that are greatly different from actual element data are used, performing the data generation process (the first process ST220) using initial values obtained based on one or more groups of most-recently-obtained element data $P_1$ through $P_M$ makes it possible to improve the accuracy of generated element data.

Figure 7:
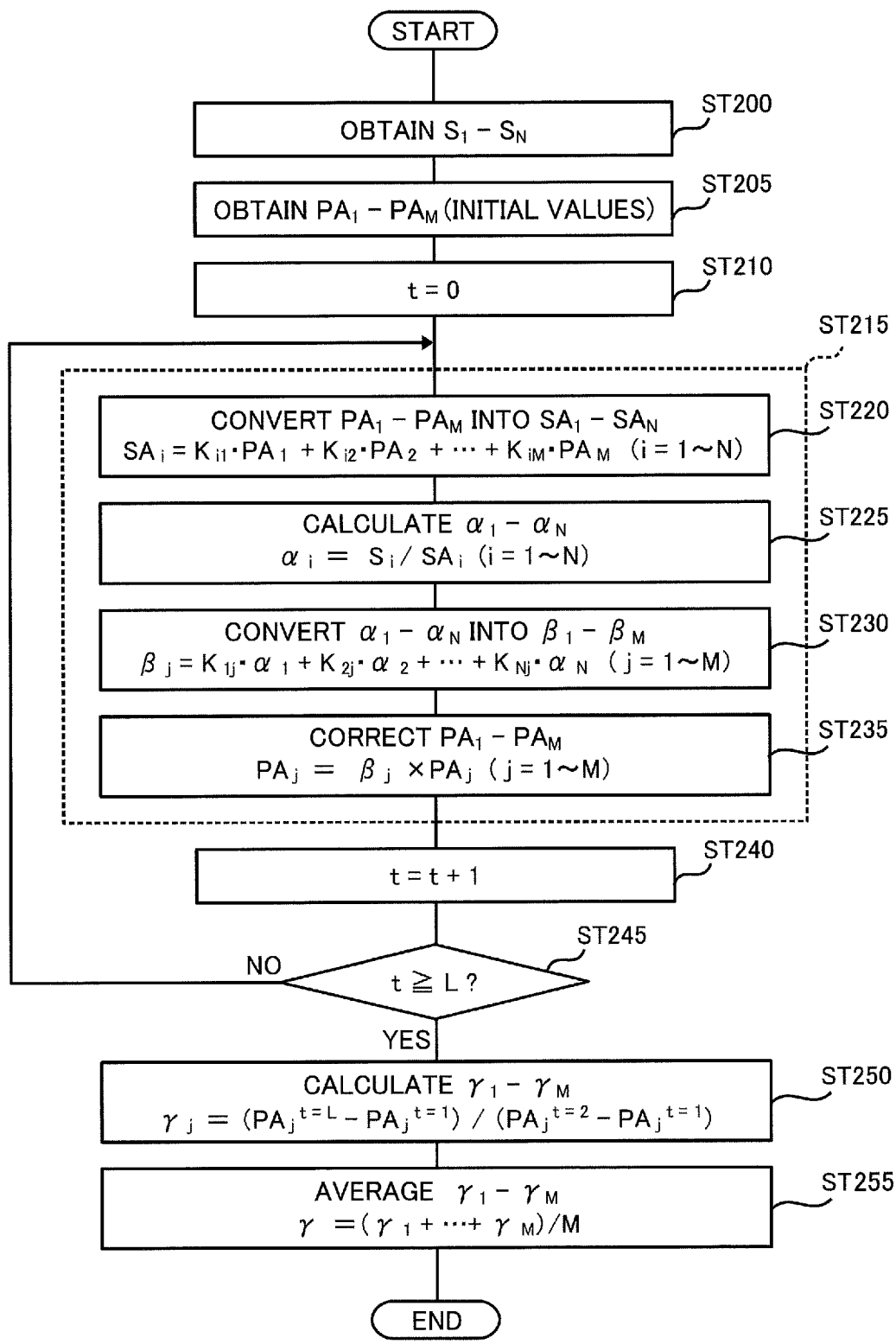
FIG. 7 is a flowchart illustrating a process of obtaining a proportionality coefficient used to calculate convergence values of element data.

ST310, ST315:

The element data generator 22 performs the data generation process similar to step ST215 in FIG. 7 two times.

ST320:

The element data generator 22 calculates element data $P_j$ according to formula (13) based on two tentative values $PA_j^{t=1}$ and $PA_j^{t=2}$ of element data obtained by the first and second data generation processes.

Figure 9:
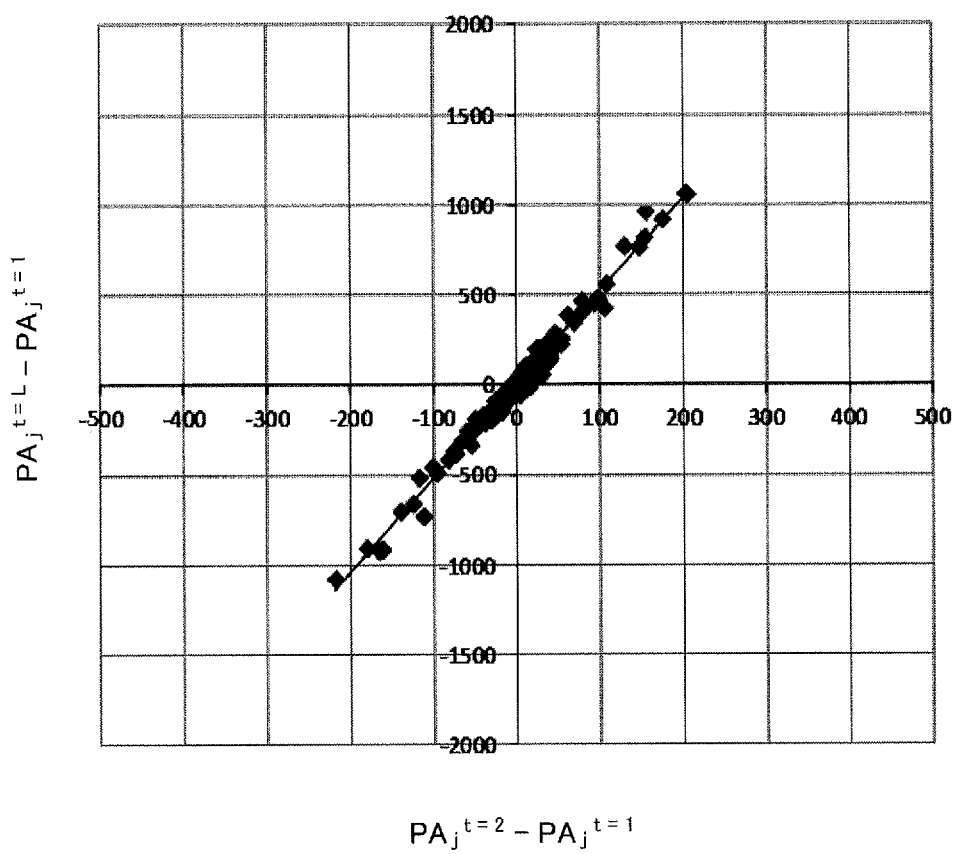
FIG. 9 is a drawing illustrating a simulation result indicating that a difference between a first tentative value of element data obtained in a first data generation process and a second tentative value of element data obtained in a second data generation process is substantially proportional to a difference between the first tentative value and a convergence value of the element data.

FIG. 9 is a drawing illustrating a simulation result indicating that the difference between a first tentative value $(PA_j^{t=1})$ of element data obtained in the first data generation process and a second tentative value $(PA_j^{t=2})$ of element data obtained in the second data generation process is substantially proportional to the difference between the first tentative value $(PA_j^{t=1})$ of element data and the convergence value of element data. In FIG. 9, the horizontal axis indicates the difference between the first tentative value $(PA_j^{t=1})$ of element data and the second tentative value $(PA_j^{t=2})$ of element data. In FIG. 9, the vertical axis indicates the difference between the first tentative value $(PA_j^{t=1})$ of element data and the convergence value $(PA_j^{t=L})$ of element data. The convergence value $(PA_j^{t=L})$ of element data is a tentative value of element data obtained in the L-th data generation process where "L" is sufficiently large. Each dot in FIG. 9 corresponds to one set of element data $P_j$. As indicated by the simulation result of FIG. 9, it is possible to calculate the final value of element data $P_j$ that is approximate to the convergence value $(PA_j^{t=L})$ of element data by using formula (13).

As described above, in the input device of the present embodiment, each of M sections $A_1$ through $A_M$ virtually dividing the operation surface 11 overlaps one or more detection regions R, and the sensor 10 generates one or more sets of detection data S for each of the detection regions R. Accordingly, the sensor 10 generates one or more sets of detection data S indicating the degree of proximity of an object for each of the M sections $A_1$ through $A_M$.

Each of M sets of element data $P_1$ through $P_M$ is a sum (formula (1)) of sets of subelement data $U_{ij}$ distributed to N sets of detection data $S_1$ through $S_N$ according to predetermined percentages (constant data $K_{ij}$, formula (3)). Each of N sets of detection data $S_1$ through $S_N$ approximates to a sum (formula (2)) of sets of subelement data $U_{ij}$ distributed from M sets of element data $P_1$ through $P_M$ according to predetermined percentages (constant data $K_{ij}$). Thus, the conversion of M sets of element data $P_1$ through $P_M$ into N sets of detection data $S_1$ through $S_N$ is defined by N sets of constant data $K_{ij}$ set for each of M sets of element data $P_1$ through $P_M$.

In the data generation process, the element data generator 22 calculates (formula (6)) tentative values $SA_1$ through $SA_N$ of N sets of detection data each of which is a sum of sets of subelement data $U_{ij}$ that are distributed from tentative values $PA_1$ through $PA_M$ of M sets of element data according to predetermined percentages (constant data $K_{ij}$). Also, the element data generator 22 corrects the tentative values $PA_1$ through $PA_M$ of M sets of element data based on M×N sets of constant data $K_{ij}$ such that the calculated tentative values $SA_1$ through $SA_N$ of N sets of detection data become closer to N sets of detection data $S_1$ through $S_N$. Convergence values of M sets of element data conforming to N sets of detection data $S_1$ through $S_N$ can be obtained by repeating this data generation process a large number of times.

However, the element data generator 22 is configured to repeat the data generation process at least two times, and calculate a value approximate to the convergence value of element data for each of M sections $A_1$ through $A_M$ by obtaining a difference between the first tentative value $(PA_j^{t=1})$ of element data obtained in the first data generation process and the second tentative value $(PA_j^{t=2})$ obtained in the second data generation process, multiplying the difference by the proportionality coefficient γ, and adding the multiplied difference to the first tentative value $(PA_j^{t=1})$ (formula (13)). Accordingly, compared with a configuration where the data generation process is repeated a large number of times to obtain convergence values of element data, the configuration of the present embodiment makes it possible to greatly reduce the number of times the data generation process is repeated and to simplify calculations.

Second Embodiment

Next, a second embodiment of the present invention is described.

Figure 10:
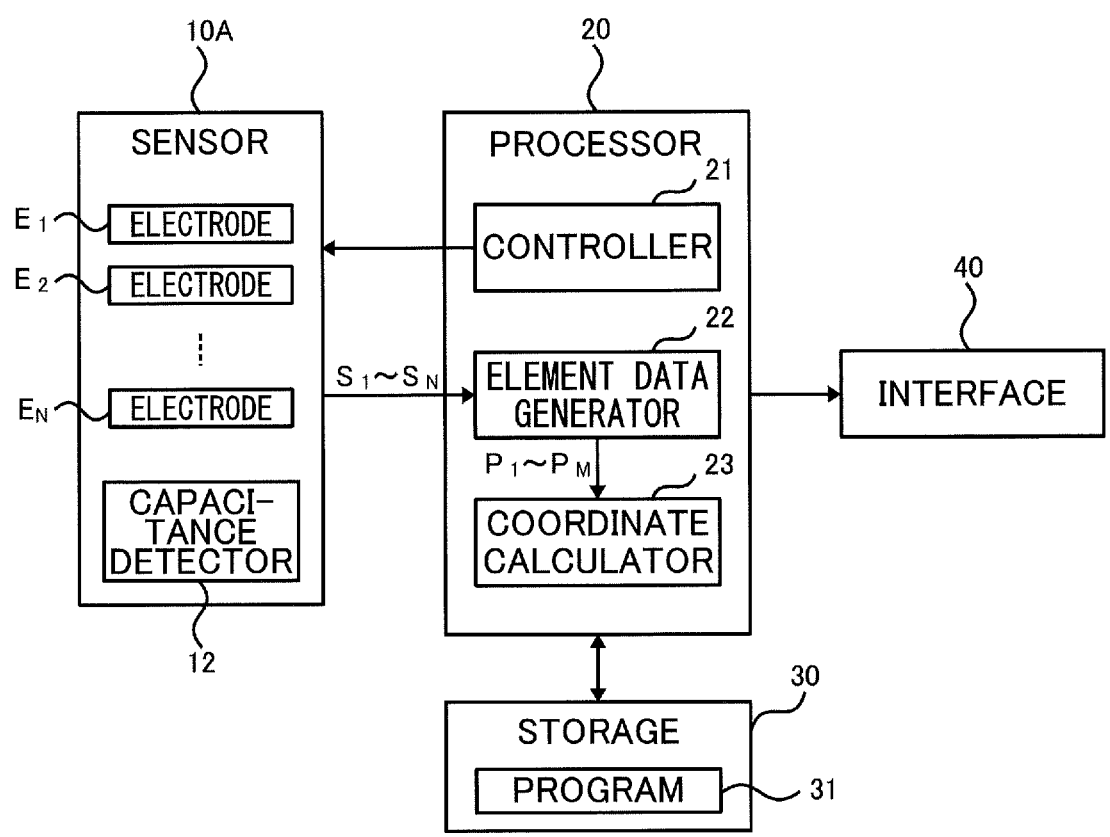
FIG. 10 is a drawing illustrating an example of a configuration of an input device according to a second embodiment.

FIG. 10 is a drawing illustrating an example of a configuration of an input device according to the second embodiment. In the input device of the second embodiment, the sensor 10 in the input device of the first embodiment is implemented as a capacitance sensor. Other configurations of the input device of the second embodiment are substantially the same as those of the input device of the first embodiment.

A sensor 10A in the input device of the second embodiment includes N electrodes $E_1$ through $E_N$ formed in different detection regions R. In the descriptions below, the N electrodes $E_1$ through $E_N$ may be referred to as "electrodes E" when distinction is not necessary.

The sensor 10A also includes a capacitance detector 12 that generates detection data S corresponding to capacitance (first capacitance) between an object brought into proximity to the operation surface 11 and the electrodes E. The capacitance detector 12 generates detection data S for each of N electrodes E.

The capacitance detector 12 drives each electrode E of the N electrodes E to sample a charge corresponding to the capacitance formed between the electrode E and the object, and outputs detection data S corresponding to the sampling result. Specifically, the capacitance detector 12 includes a drive circuit, a capacitance-voltage conversion circuit (CV conversion circuit), and an A/D conversion circuit. The drive circuit selects the N electrodes E sequentially under the control of the processor 20, repeatedly applies a pulse voltage with a predetermined amplitude to the selected electrode E, and repeatedly charges or discharges capacitance formed between the electrode E and the object. The CV conversion circuit transfers a charge that flows through the electrode E (or a charge proportional to the charge) as a result of the charging or the discharging to store the charge in a reference capacitor, and outputs a signal corresponding to a voltage generated in the reference capacitor. Under the control of the processor 20, the A/D conversion circuit converts the signal output from the CV conversion circuit into a digital signal at a predetermined cycle, and outputs the digital signal as the detection data S. In the descriptions below, "Si" indicates detection data of capacitance of an electrode Ei.

Figure 11:
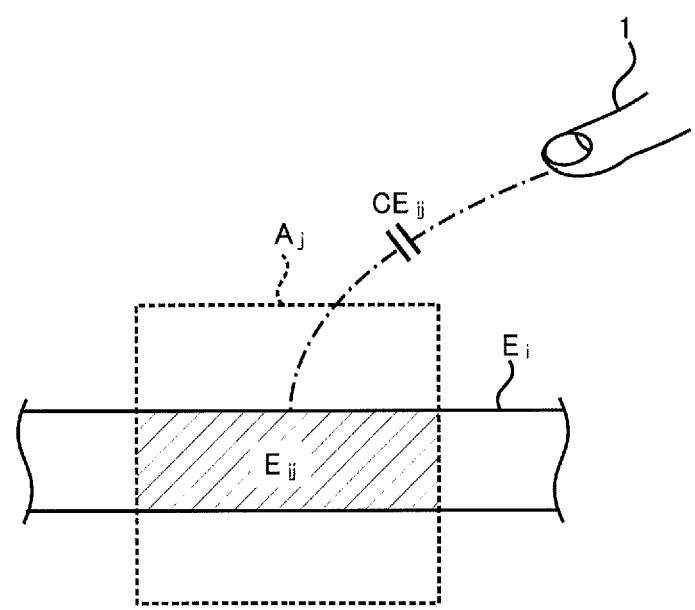
FIG. 11 is a drawing illustrating second capacitance between an object and an overlapping portion of an electrode in a section.

FIG. 11 is a drawing illustrating second capacitance $CE_{ij}$ between an object 1 and an overlapping portion $E_{ij}$ of an electrode $E_i$ in a section $A_j$. In FIG. 11, "$E_{ij}$" indicates a portion of the electrode $E_i$ overlapping the section $A_j$. Also, "$CE_{ij}$" indicates capacitance (second capacitance) formed between the overlapping portion $E_{ij}$ of the electrode $E_i$ and the object 1 such as a finger.

Although the number of the electrodes $E_1$ through $E_N$ is less than the number of the sections $A_1$ through $A_M$, the electrodes $E_1$ through $E_N$ are arranged such that one or more overlapping portions $E_{ij}$ of one or more electrodes E overlap each section A.

Also, the electrodes $E_1$ through $E_N$ are arranged to overlap different combinations of sections A. For example, when the electrode $E_1$ overlaps sections $A_1$ and $A_2$, another electrode E is disposed to overlap a combination of sections A other than the combination $A_1$ and $A_2$. When multiple electrodes E overlap the same combination of sections A, the electrodes E may be arranged such that the areas of overlapping portions of the electrodes E in at least one of the sections A become different from each other.

That is, the electrodes $E_1$ through $E_N$ are arranged on the operation surface 11 such that the electrodes $E_1$ through $E_N$ overlap the sections $A_1$ through $A_M$ in different patterns.

When "third capacitance $CA_j$" indicates capacitance formed between all overlapping portions $E_{ij}$ of electrodes E in the section $A_j$ and the object 1, a variation $\Delta CA_j$ of the third capacitance $CA_j$ is substantially equal to the sum of second capacitance variations $\Delta CE_{ij}$ of the electrodes E in the section $A_j$ and is expressed by formula (16) below.

[Formula 16]

$$\Delta CA_j = \sum_{i=1}^{N} \Delta CE_{ij} \qquad (16)$$

In formula (16), if an electrode $E_i$ has no overlapping portion $E_{ij}$ overlapping the section $A_j$, the second capacitance variation $\Delta CE_{ij}$ is set at zero.

When "first capacitance $CE_i$" indicates capacitance formed between an electrode $E_i$ and an object, a variation $\Delta CE_i$ of the first capacitance $CE_i$ is substantially equal to the sum of second capacitance variations $\Delta CE_{ij}$ of all overlapping portions $E_{ij}$ belonging to the electrode $E_i$ and is expressed by formula (17) below.

[Formula 17]

$$\Delta CE_i = \sum_{j=1}^{M} \Delta CE_{ij} \qquad (17)$$

The second capacitance $CE_{ij}$ formed between one overlapping portion $E_{ij}$ and the object 1 is substantially proportional to the area of the overlapping portion $E_{ij}$. The third capacitance $CA_j$ (formula (16)) formed between all overlapping portions of electrodes $E_i$ in a section $A_j$ and the object 1 is substantially proportional to the areas of the all overlapping portions in the section $A_j$. When the ratio of the area of an overlapping portion $E_{ij}$ to the area of all overlapping portions in the same section $A_j$ is expressed by constant data $K_{ij}$, the constant data $K_{ij}$ indicates the ratio of the second capacitance variation $\Delta CE_{ij}$ to the third capacitance variation $\Delta CA_j$ as indicated by formula (18) below.

[Formula 18]

$$K_{ij} = \frac{\Delta CE_{ij}}{\Delta CA_j} \qquad (18)$$

Using the relationship of formula (18), formula (17) can be rewritten into formula (19) below.

[Formula 19]

$$\Delta CE_i = \sum_{j=1}^{M} K_{ij} \Delta CA_j \qquad (19)$$

Formula (19) can also be rewritten into formula (20) using matrices.

[Formula 20]

$$\underbrace{\begin{bmatrix} K_{11} & K_{12} & \ldots & K_{1M} \\ K_{21} & & & K_{2M} \\ \vdots & & & \vdots \\ K_{N1} & K_{N2} & \ldots & K_{NM} \end{bmatrix}}_{K} \begin{bmatrix} \Delta CA_1 \\ \Delta CA_2 \\ \vdots \\ \Delta CA_M \end{bmatrix} = \begin{bmatrix} \Delta CE_1 \\ \Delta CE_2 \\ \vdots \\ \Delta CE_N \end{bmatrix} \qquad (20)$$

Here, the element data $P_j$ of the section $A_j$ is proportional to the third capacitance variation $\Delta CA_j$, the detection data $S_i$ of capacitance detected by the capacitance detector 12 is proportional to the first capacitance variation $\Delta CE_i$, and the subelement data $U_{ij}$ of the overlapping portion $E_{ij}$ is proportional to the second capacitance variation $\Delta CE_{ij}$. That is, the following formulas are true.

[Formulas 21]

$$P_j \propto \Delta CA_j \qquad (21\text{-}1)$$

$$S_i \propto \Delta CE_i \qquad (21\text{-}2)$$

$$U_{ij} \propto \Delta CE_{ij} \qquad (21\text{-}3)$$

Taking into account formulas (21-1) through (21-3), formulas (16) through (20) are equal to formulas (1) through (5) described above. Accordingly, similarly to the first embodiment, the second embodiment makes it possible to generate M sets of element data $P_1$ through $P_M$ based on N sets of detection data $S_1$ through $S_N$.

Figure 12A:
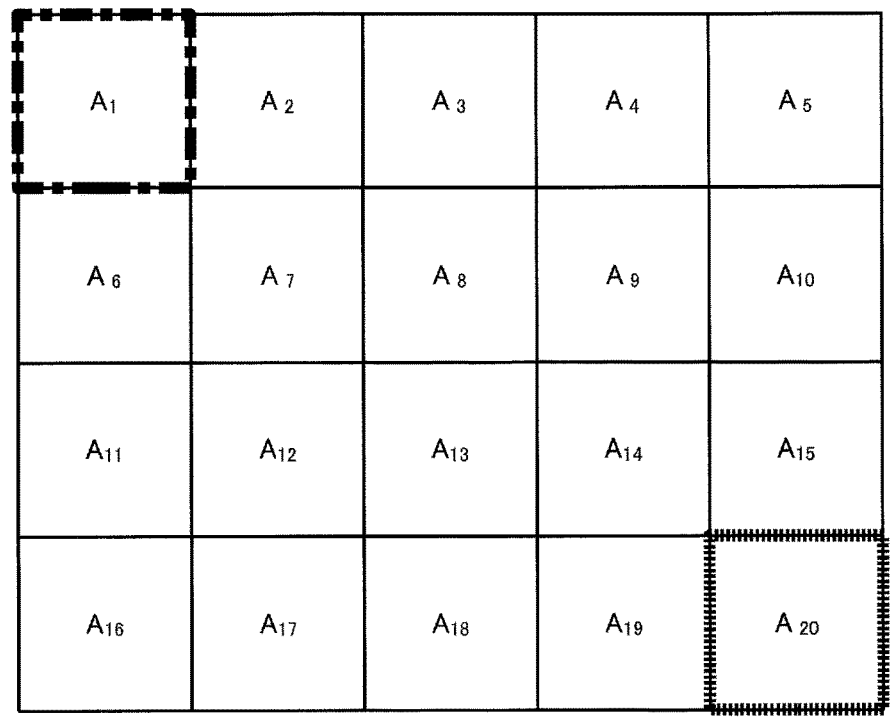
FIG. 12A is a drawing illustrating multiple sections on an operation surface.
Figure 12B:
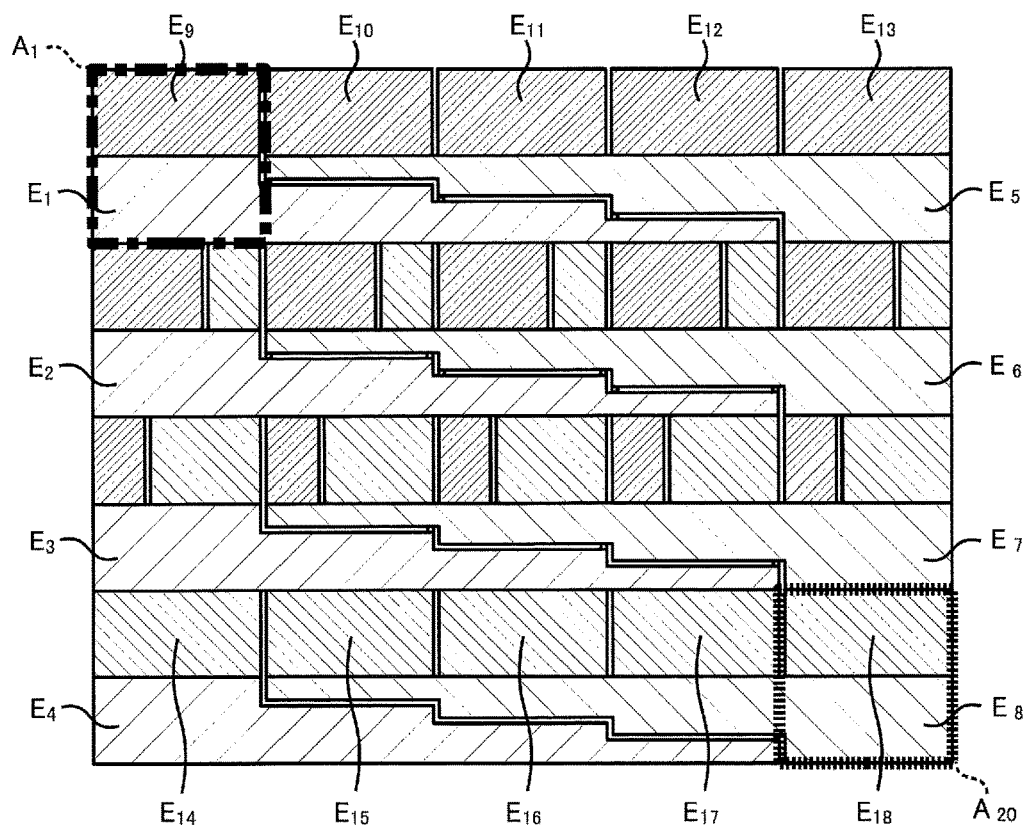
FIG. 12B is a drawing illustrating a pattern of electrodes overlapping the sections according to the second embodiment.
Figure 13A:
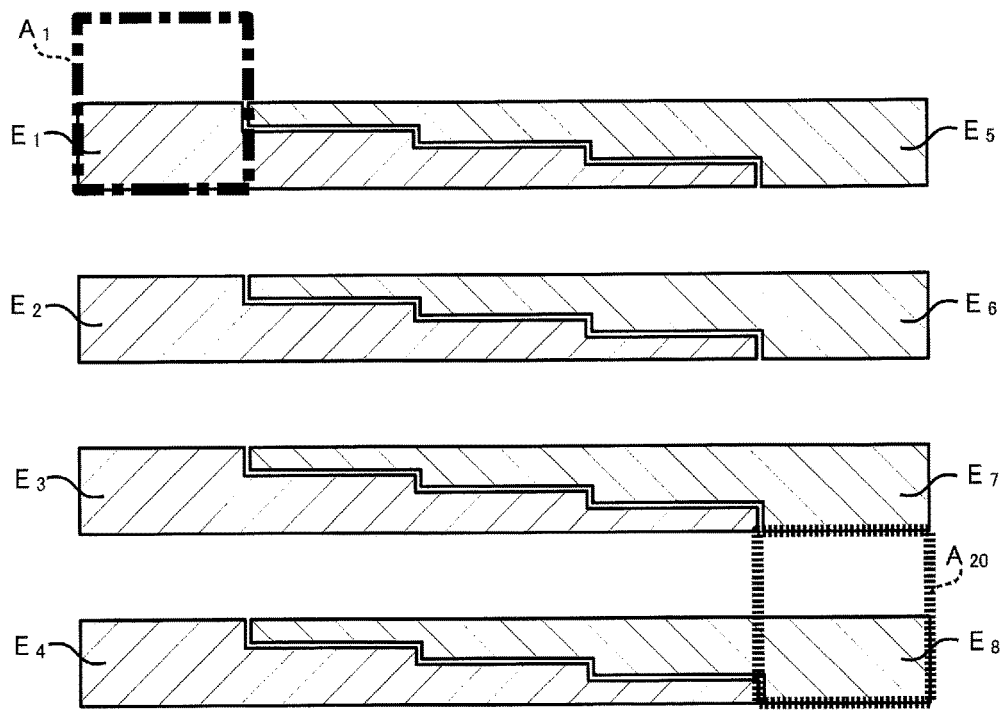
FIG. 13A is a drawing illustrating a pattern of electrodes formed in an upper layer.
Figure 13B:
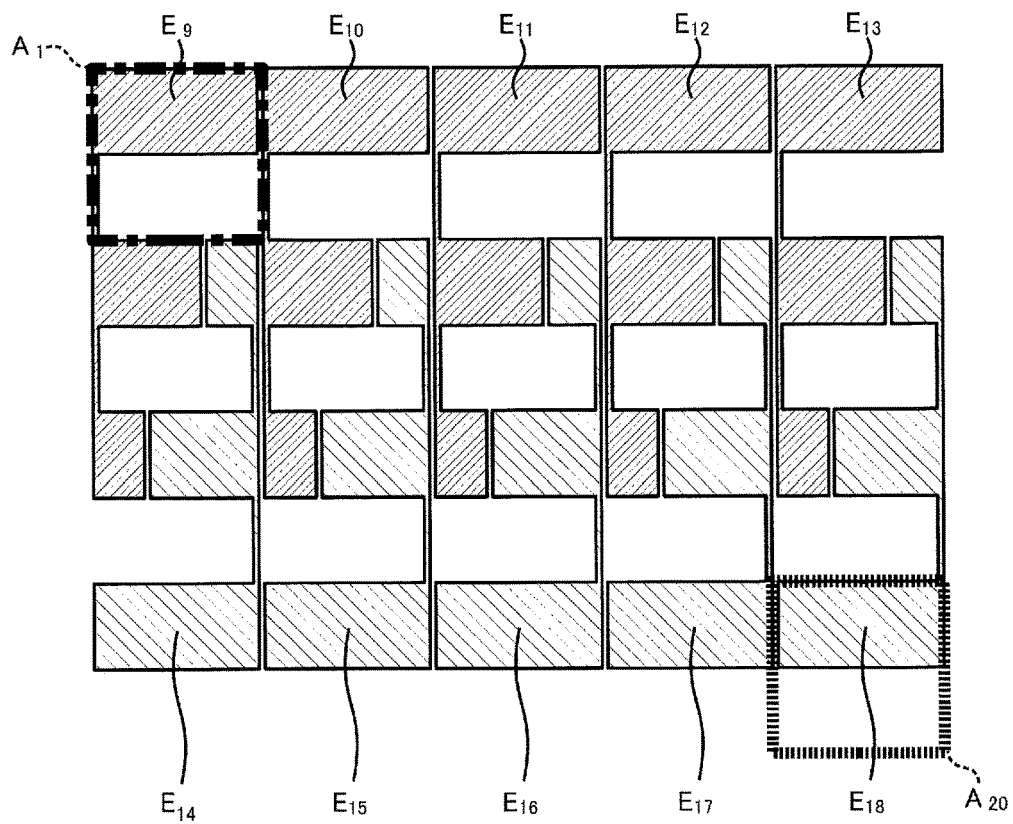
FIG. 13B is a drawing illustrating a pattern of electrodes formed in a lower layer.

FIGS. 12A and 12B illustrate a pattern of electrodes in the input device of the second embodiment. FIG. 12A illustrates 20 sections ($A_1$ through $A_{20}$) on the operation surface 11, and FIG. 12B illustrates a pattern of 18 electrodes ($E_1$ through $E_{18}$) overlapping the sections A. FIGS. 13A and 13B illustrate details of the pattern of electrodes ($E_1$ through $E_{18}$) illustrated in FIG. 12B. FIG. 13A illustrates a pattern of 8 electrodes ($E_1$ through $E_8$) formed in an upper layer, and FIG. 13B illustrates a pattern of 10 electrodes ($E_9$ through $E_{18}$) formed in a lower layer.

In the example of FIGS. 12A and 12B, the operation surface 11 of the sensor 10A has a substantially-rectangular shape and is divided into 20 sections $A_1$ through $A_{20}$ forming a 4×5 grid pattern. The sections $A_1$ through $A_5$ are arranged in numeric order from the first column to the fifth column in the first row, the sections $A_6$ through $A_{10}$ are arranged in numeric order from the first column to the fifth column in the second row, the sections $A_{11}$ through $A_{15}$ are arranged in numeric order from the first column to the fifth column in the third row, and the sections $A_{16}$ through $A_{20}$ are arranged in numeric order from the first column to the fifth column in the fourth row.

In the example of FIG. 13A, the electrodes $E_1$ through $E_4$ are disposed in the first through fourth rows of the grid pattern in this order and extend from the first column to the fourth column. Each of the electrodes $E_1$ through $E_4$ occupies 4/8 of the area of the section in the first column, occupies 3/8 of the area of the section in the second column, occupies 2/8 of the area of the section in the third column, and occupies 1/8 of the area of the section in the fourth column.

The electrodes $E_5$ through $E_8$ are disposed in the first through fourth rows of the grid pattern in this order and extend from the fifth column to the second column. Each of the electrodes $E_5$ through $E_8$ occupies 4/8 of the area of the section in the fifth column, occupies 3/8 of the area of the section in the fourth column, occupies 2/8 of the area of the section in the third column, and occupies 1/8 of the area of the section in the second column.

In the example of FIG. 13B, the electrodes $E_9$ through $E_{13}$ are disposed in the first through fifth columns of the grid pattern in this order and extend from the first row to the third row. Each of the electrodes $E_9$ through $E_{13}$ occupies 3/6 of the area of the section in the first row, occupies 2/6 of the area of the section in the second row, and occupies 1/6 of the area of the section in the third row.

The electrodes $E_{14}$ through $E_{18}$ are disposed in the first through fourth columns of the grid pattern in this order and extend from the fourth row to the second column. Each of the electrodes $E_{14}$ through $E_{18}$ occupies 3/6 of the area of the section in the fourth row, occupies 2/6 of the area of the section in the third row, and occupies 1/6 of the area of the section in the second row.

Taking the electrode $E_1$ in the first row as an example, the electrode $E_1$ occupies 4/8 of the area of the section $A_1$, occupies 3/8 of the area of the section $A_2$, occupies 2/8 of the area of the section $A_3$, and occupies 1/8 of the area of the section $A_4$. Accordingly, constant data $K_{11}$ for the electrode $E_1$ in the section $A_1$ is 4/8, constant data $K_{12}$ for the electrode $E_1$ in the section $A_2$ is 3/8, constant data $K_{13}$ for the electrode $E_1$ in the section $A_3$ is 2/8, and constant data $K_{14}$ for the electrode $E_1$ in the section $A_4$ is 1/8. Through similar calculations, the first conversion matrix K including 18×20 sets of constant data $K_{ij}$ is represented by formula (22) below.

[Formulas 22]

$$K = \begin{bmatrix}
0.5 & 0.38 & 0.25 & 0.13 & 0 & 0 & 0 & 0 & 0 & 0 & 0 & 0 & 0 & 0 & 0 & 0 & 0 & 0 & 0 & 0 \\
0 & 0 & 0 & 0 & 0 & 0.5 & 0.38 & 0.25 & 0.13 & 0 & 0 & 0 & 0 & 0 & 0 & 0 & 0 & 0 & 0 & 0 \\
0 & 0 & 0 & 0 & 0 & 0 & 0 & 0 & 0 & 0 & 0.5 & 0.38 & 0.25 & 0.13 & 0 & 0 & 0 & 0 & 0 & 0 \\
0 & 0 & 0 & 0 & 0 & 0 & 0 & 0 & 0 & 0 & 0 & 0 & 0 & 0 & 0 & 0.5 & 0.38 & 0.25 & 0.13 & 0 \\
0 & 0.13 & 0.25 & 0.38 & 0.5 & 0 & 0 & 0 & 0 & 0 & 0 & 0 & 0 & 0 & 0 & 0 & 0 & 0 & 0 & 0 \\
0 & 0 & 0 & 0 & 0 & 0 & 0.13 & 0.25 & 0.38 & 0.5 & 0 & 0 & 0 & 0 & 0 & 0 & 0 & 0 & 0 & 0 \\
0 & 0 & 0 & 0 & 0 & 0 & 0 & 0 & 0 & 0 & 0.13 & 0.25 & 0.38 & 0.5 & 0 & 0 & 0 & 0 & 0 & 0 \\
0 & 0 & 0 & 0 & 0 & 0 & 0 & 0 & 0 & 0 & 0 & 0 & 0 & 0 & 0 & 0.13 & 0.25 & 0.38 & 0.5 \\
0.5 & 0 & 0 & 0 & 0 & 0.33 & 0 & 0 & 0 & 0 & 0.17 & 0 & 0 & 0 & 0 & 0 & 0 & 0 & 0 & 0 \\
0 & 0.5 & 0 & 0 & 0 & 0 & 0.33 & 0 & 0 & 0 & 0 & 0.17 & 0 & 0 & 0 & 0 & 0 & 0 & 0 & 0 \\
0 & 0 & 0.5 & 0 & 0 & 0 & 0 & 0.33 & 0 & 0 & 0 & 0 & 0.17 & 0 & 0 & 0 & 0 & 0 & 0 & 0 \\
0 & 0 & 0 & 0.5 & 0 & 0 & 0 & 0 & 0.33 & 0 & 0 & 0 & 0 & 0.17 & 0 & 0 & 0 & 0 & 0 & 0 \\
0 & 0 & 0 & 0 & 0.5 & 0 & 0 & 0 & 0 & 0.33 & 0 & 0 & 0 & 0 & 0.17 & 0 & 0 & 0 & 0 & 0 \\
0 & 0 & 0 & 0 & 0 & 0.17 & 0 & 0 & 0 & 0 & 0.33 & 0 & 0 & 0 & 0 & 0.5 & 0 & 0 & 0 & 0 \\
0 & 0 & 0 & 0 & 0 & 0 & 0.17 & 0 & 0 & 0 & 0 & 0.33 & 0 & 0 & 0 & 0 & 0.5 & 0 & 0 & 0 \\
0 & 0 & 0 & 0 & 0 & 0 & 0 & 0.17 & 0 & 0 & 0 & 0 & 0.33 & 0 & 0 & 0 & 0 & 0.5 & 0 & 0 \\
0 & 0 & 0 & 0 & 0 & 0 & 0 & 0 & 0.17 & 0 & 0 & 0 & 0 & 0.33 & 0 & 0 & 0 & 0 & 0.5 & 0 \\
0 & 0 & 0 & 0 & 0 & 0 & 0 & 0 & 0 & 0.17 & 0 & 0 & 0 & 0 & 0.33 & 0 & 0 & 0 & 0 & 0.5
\end{bmatrix} \quad (22)$$

As described above, similarly to the input device of the first embodiment, the input device of the second embodiment, which detects the degree of proximity of an object based on capacitance, can also generate, though simplified calculations, multiple sets of element data P whose number is greater than the number of sets of detection data S.

Third Embodiment

Next, a third embodiment of the present invention is described.

Figure 14:
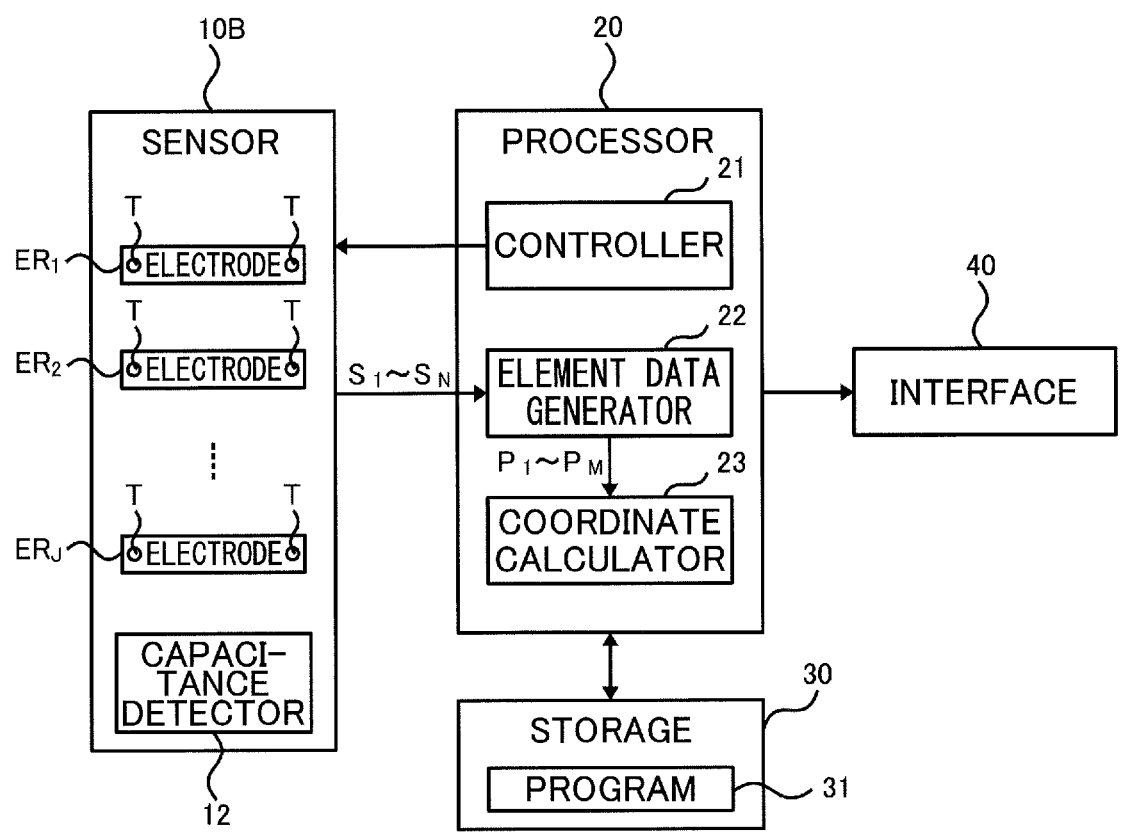
FIG. 14 is a drawing illustrating an example of a configuration of an input device according to a third embodiment.

FIG. 14 is a drawing illustrating an example of a configuration of an input device according to the third embodiment. In the input device of the third embodiment, the sensor 10A in the input device of the second embodiment is replaced with a sensor 10B. Other configurations of the input device of the third embodiment are substantially the same as those of the input device of the second embodiment.

The sensor 10B includes J electrodes $ER_1$ through $ER_J$ formed in different detection regions R. In the descriptions below, the J electrodes $ER_1$ through $ER_J$ may be referred to as "electrodes ER" when distinction is not necessary.

Each electrode ER includes multiple terminals T, and the J electrodes ER include N terminals T in total. In the example of FIG. 14, because each electrode ER includes two terminals T, the number (J) of electrodes ER is one half of the number (N) of the terminals T. As a variation of the third embodiment, each electrode ER may include three or more terminals T.

The electrode ER is formed of a material (e.g., ITO used for a transparent conductive film) that has a resistance higher than a general metal.

The capacitance detector 12 receives charges stored between an object in proximity to the operation surface 11 and electrodes ER through N terminals T and generates, for each of the N terminals T, detection data S corresponding to the capacitance between the object and the electrode ER based on the received charges.

Also, when receiving a charge stored in one electrode ER, the capacitance detector 12 receives the charge from multiple terminals T provided on the electrode ER at the same time. For this reason, the charge stored on the electrode ER is distributed to multiple terminals T. Here, it is supposed that the percentage of distribution of the charge is proportional to the conductance (inverse number of resistance) between the terminal T and a position on the electrode ER at which the charge is stored. In other words, a larger amount of charge is distributed to a terminal T with larger conductance.

Figure 15:
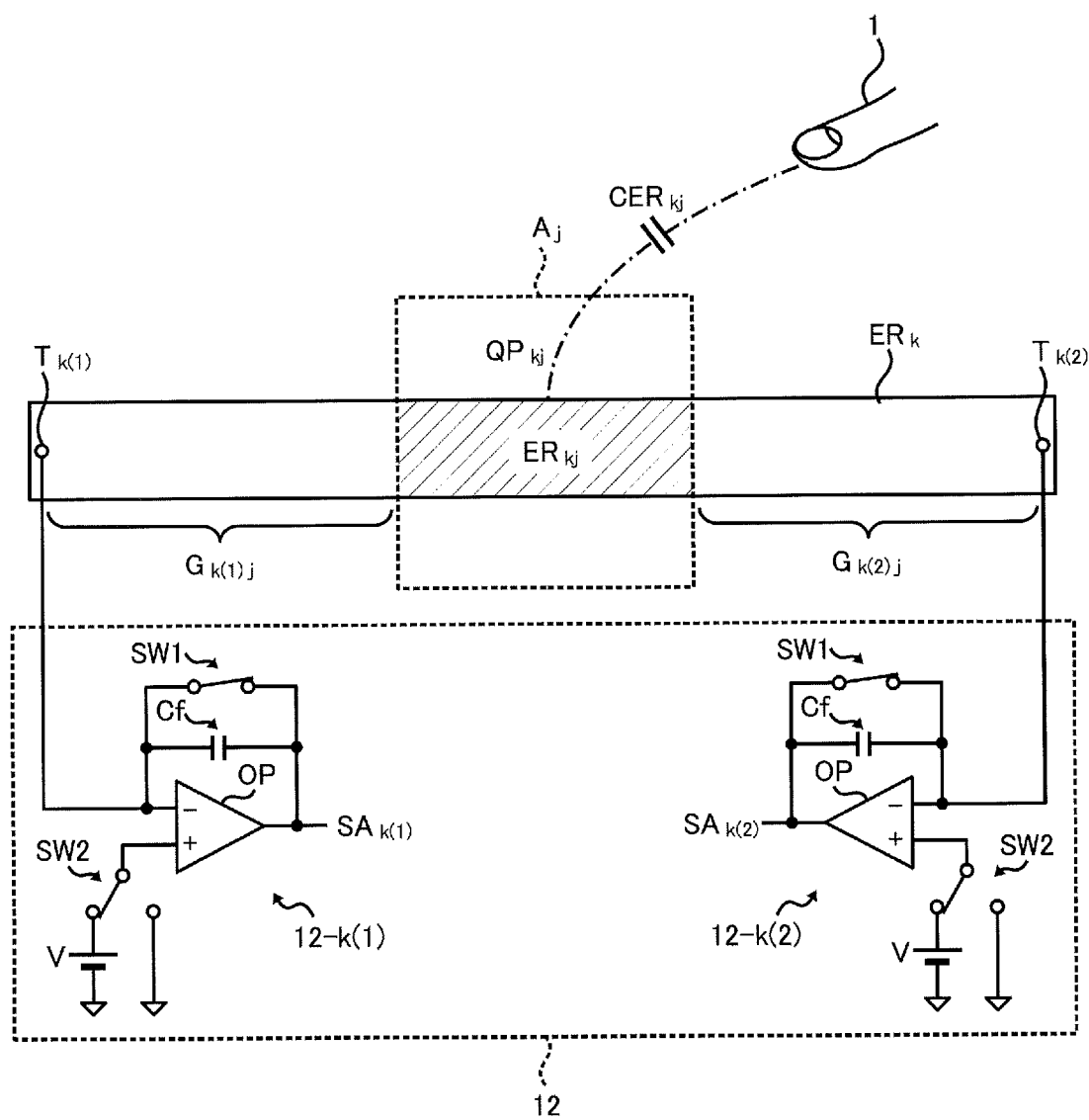
FIG. 15 is a drawing illustrating a state where an electric charge is stored between an object and an overlapping portion of an electrode in a section.
Figure 16:
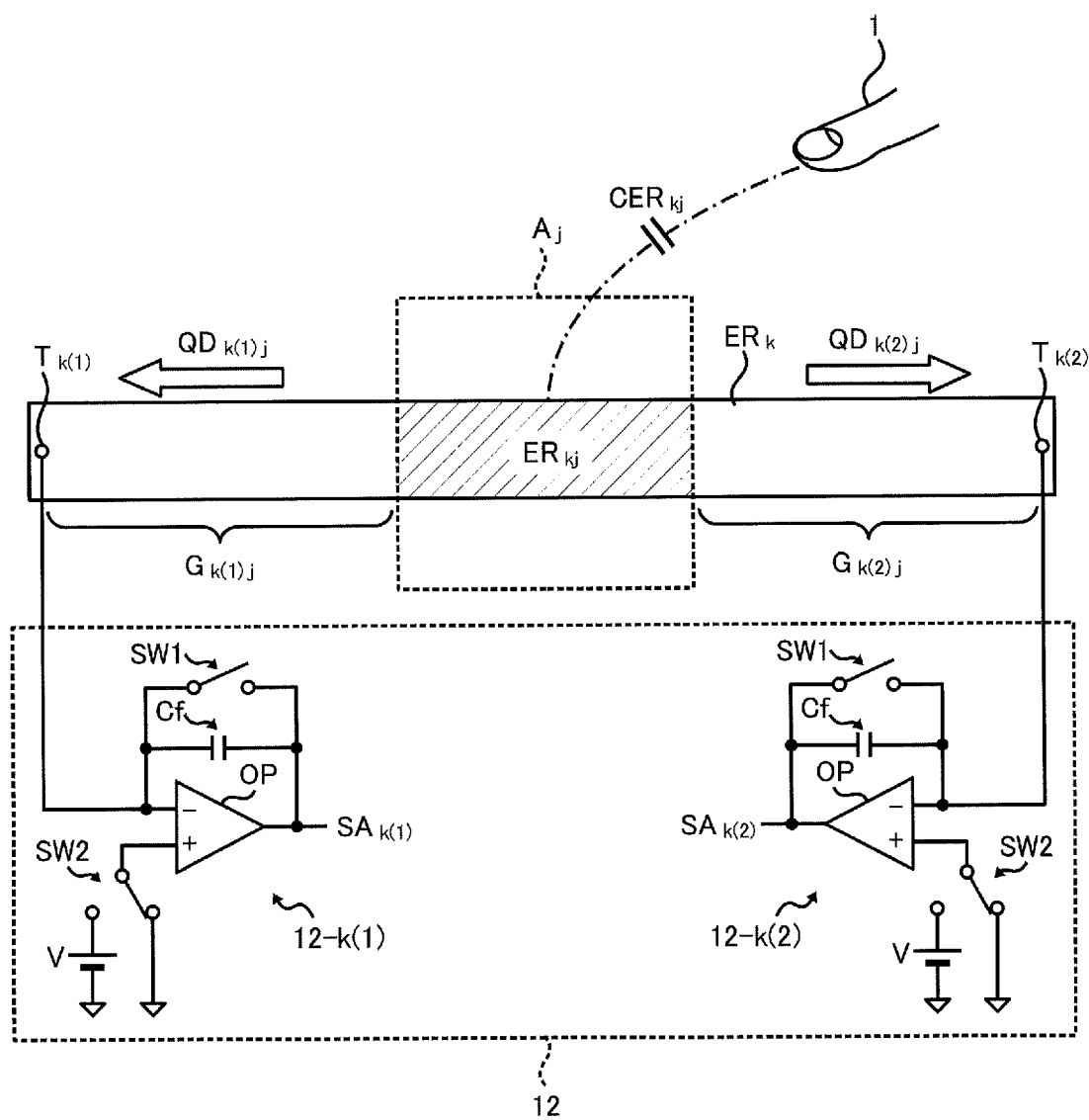
FIG. 16 is a drawing illustrating a state where an electric charge stored in an electrode in a section is distributed to two terminals.

FIG. 15 is a drawing illustrating a state where a partial charge $QP_{kj}$ is stored between the object 1 and an overlapping portion $ER_{kj}$ of an electrode $ER_k$ in a section $A_j$. FIG. 16 is a drawing illustrating a state where the partial charge $QP_{kj}$ is distributed to two terminals $T_{k(1)}$ and $T_{k(2)}$ of the electrode $ER_k$. Here, "k" indicates an integer between 1 and J. Also, each of "k(1)" and "k(2)" indicates an integer between 1 and N associated with the integer k.

In FIGS. 15 and 16, "$G_{k(1)j}$" indicates conductance between the overlapping portion $ER_{kj}$ and the terminal $T_{k(1)}$, and "$G_{k(2)j}$" indicates conductance between the overlapping portion $ER_{kj}$ and the terminal $T_{k(2)}$. Also, "$CER_{kj}$" indicates capacitance between the overlapping portion $ER_{kj}$ and the object 1.

In FIG. 16, "$QD_{k(1)j}$" indicates a distributed charge distributed from the partial charge $QP_{kj}$ to the terminal $T_{k(1)}$. Also, "$QD_{k(2)j}$" indicates a distributed charge distributed from the partial charge $QP_{kj}$ to the terminal $T_{k(2)}$.

The capacitance detector 12 includes two charge amplifiers 12-$k$(1) and 12-$k$(2) for receiving charges from the two terminals $T_{k(1)}$ and $T_{k(2)}$ at the same time Each of the charge amplifiers 12-$k$(1) and 12-$k$(2) includes an operational amplifier OP, a capacitor Cf, and switches SW1 and SW2. The capacitor Cf and the switch SW1 are connected in parallel between the output terminal and the inverting input terminal of the operational amplifier OP. The switch SW3 selectively inputs a ground potential or a driving voltage V to the non-inverting input terminal of the operational amplifier OP. The inverting input terminal of the operational amplifier OP is connected to the corresponding terminal T of the electrode $ER_{kj}$.

In the state of FIG. 15, in each of the charge amplifiers 12-$k$(1) and 12-$k$(2), the switch SW1 is turned on, and the switch SW2 is switched to input the driving voltage V to the non-inverting input terminal of the operational amplifier OP. As a result, the driving voltage V is applied to the two terminals $T_{k(1)}$ and $T_{k(2)}$, and the partial charge $QP_{kj}$ is stored between the object 1 and the overlapping portion $ER_{kj}$.

In the state of FIG. 16, the switches SW1 of the charge amplifiers 12-$k$(1) and 12-$k$(2) are turned off at the same time, and the switches SW2 are switched at the same time to input the ground potential to the non-inverting input terminals of the operational amplifiers OP. As a result, charges are transferred to the charge amplifiers 12-$k$(1) and 12-$k$(2) such that the two terminals Tk(1) and Tk(2) become the ground potential. The transfer of the charge to the charge amplifier 12-$k$(1) and the transfer of the charge to the charge amplifier 12-$k$(2) are started at substantially the same time.

The partial charge $QP_{kj}$ is the sum of the distributed charge $QD_{k(1)j}$ distributed to the terminal $T_{k(1)}$ and the distributed charge $QD_{k(2)j}$ distributed to the terminal $T_{k(2)}$ and is expressed by formula (23) below.

[Formulas 23]

$$QP_{kj}=QD_{k(1)j}+QD_{k(2)j} \qquad (23)$$

The distributed charge $QD_{k(1)j}$ and the distributed charge $QD_{k(2)j}$ are proportional to the conductance $G_{k(1)j}$ between the overlapping portion $ER_{kj}$ and the terminal Tk(1) and the conductance $G_{k(2)j}$ between the overlapping portion $ER_{kj}$ and the terminal Tk(2), respectively. When "$KG_{k(1)j}$" and "$KG_{k(2)j}$" are coefficients indicating conductance ratios, the distributed charge $QD_{k(1)j}$ and the distributed charge $QD_{k(2)j}$ are represented by formulas (24-1) and (24-2) below.

[Formulas 24]

$$QD_{k(1)j}=KG_{k(1)j} \times QP_{kj} \qquad (24\text{-}1)$$

$$QD_{k(2)j}=KG_{k(2)j} \times QP_{kj} \qquad (24\text{-}2)$$

The coefficients $KG_{k(1)j}$ and $KG_{k(2)j}$ are expressed by formulas (25-1) and (25-2) using the conductance $G_{k(1)j}$ and the conductance $G_{k(2)j}$.

[Formulas 25]

$$KG_{k(1)j} = \frac{G_{k(1)j}}{(G_{k(1)j} + G_{k(2)j})} \qquad (25\text{-}1)$$

$$KG_{k(2)j} = \frac{G_{k(2)j}}{(G_{k(2)j} + G_{k(2)j})} \qquad (25\text{-}2)$$

When "$Q_j$" indicates a combined charge obtained by combining all partial charges $QP_{kj}$ stored in overlapping portions $ER_{kj}$ of all electrodes $ER_k$ in the section $A_j$, the combined charge $Q_j$ is expressed by formula (26) below.

[Formula 26]

$$Q_j = \sum_{k=1}^{J} QP_{kj} \qquad (26)$$

The partial charge $QP_{kj}$ is proportional to the capacitance $CER_{kj}$ between the object 1 and the overlapping portion $ER_{kj}$ in the section Aj, and the capacitance $CER_{kj}$ is substantially proportional to the area of the overlapping portion $ER_{kj}$.

Accordingly, when "$KS_{kj}$" indicates the area ratio of the overlapping portion $ER_{kj}$ of the electrode $ER_k$ in the section $A_j$ to all overlapping portions of electrodes in the section $A_j$, the partial charge $QP_{kj}$ is expressed by formula (27) below.

[Formula 27]

$$QP_{kj} = KS_{kj} \times Q_j \tag{27}$$

When formula (27) is substituted in formulas (24-1) and (24-2), formulas (28-1) and (28-2) are obtained.

[Formula 28]

$$QD_{k(1)j} = KG_{k(1)j} \times KS_{kj} \times Q_j \tag{28-1}$$

$$QD_{k(2)j} = KG_{k(2)j} \times KS_{kj} \times Q_j \tag{28-2}$$

When "$K_{k(1)j}$" and "$K_{k(2)j}$" are substituted for coefficients multiplying the combined charge $Q_j$ in formulas (28-1) and (28-2), these coefficients are expressed by formulas (29-1) and (29-2) below.

[Formula 29]

$$K_{k(1)j} = KG_{k(1)j} \times KS_{kj} \tag{29-1}$$

$$K_{k(2)j} = KG_{k(2)j} \times KS_{kj} \tag{29-2}$$

Because each of "k(1)" and "k(2)" is an integer between 1 and N, formulas (29-1) and (29-2) can be rewritten into formula (30) by replacing "k(1)" and "k(2)" with an integer "i".

[Formula 30]

$$K_{ij} = KG_{ij} \times KS_{kj} \tag{30}$$

When formula (30) is substituted in formulas (28-1) and (28-2), the distributed charge $QD_{ij}$ is expressed by formula (31) below.

[Formula 31]

$$QD_{ij} = K_{ij} \times Q_j \tag{31}$$

When "$QDi$" indicates a detection charge that is input from the terminal $T_i$ to the capacitance detector 12 and obtained by totaling all distributed charges $QD_{ij}$ related to the terminal $T_i$, formula (32) is obtained from formula (31).

[Formula 32]

$$QD_i = \sum_{j=1}^{M} K_{ij} Q_j \tag{32}$$

Formula (32) can also be rewritten into formula (33) using matrices.

[Formula 33]

$$\underbrace{\begin{bmatrix} K_{11} & K_{12} & \cdots & K_{1M} \\ K_{21} & & & K_{2M} \\ \vdots & & & \vdots \\ K_{N1} & K_{N2} & \cdots & K_{NM} \end{bmatrix}}_{K} \begin{bmatrix} Q_1 \\ Q_2 \\ \vdots \\ Q_M \end{bmatrix} = \begin{bmatrix} QD_1 \\ QD_2 \\ \vdots \\ QD_N \end{bmatrix} \tag{33}$$

The combined charge $Q_j$ of the section $A_j$ is obtained by totaling all distributed charges QDij related to the section Aj and can be expressed by formula (34) below.

[Formula 34]

$$Q_j = \sum_{i=1}^{N} QD_{ij} \tag{34}$$

Here, the element data $P_j$ of the section $A_j$ is proportional to the combined charge $Q_j$, the detection data $S_i$ of the terminal $T_i$ detected by the capacitance detector 12 is proportional to the detection charge $QD_i$, and the subelement data Uij of the overlapping portion Eij is proportional to the distributed charge $QD_{ij}$. That is, the following formulas are true.

[Formula 35]

$$P_j \propto Q_j \tag{35-1}$$

$$S_i \propto QD_i \tag{35-2}$$

$$U_{ij} \propto QD_{ij} \tag{35-3}$$

Taking into account formulas (35-1) through (35-3), formulas (31), (32), (33), and (34) are equal to formulas (3), (4), (5), and (1) described above. Accordingly, similarly to the first embodiment, the third embodiment makes it possible to generate M sets of element data $P_1$ through $P_M$ based on N sets of detection data $S_1$ through $S_N$.

Figure 17A:
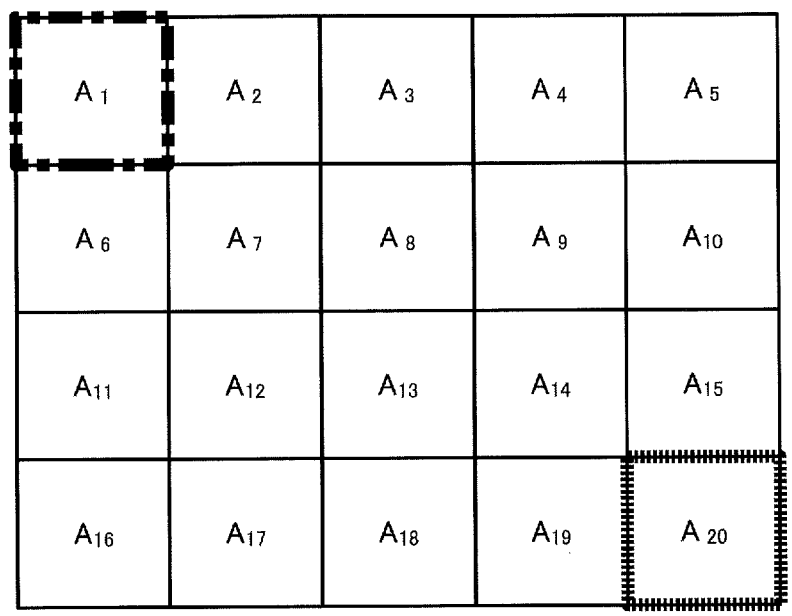
FIG. 17A is a drawing illustrating multiple sections on an operation surface.
Figure 17B:
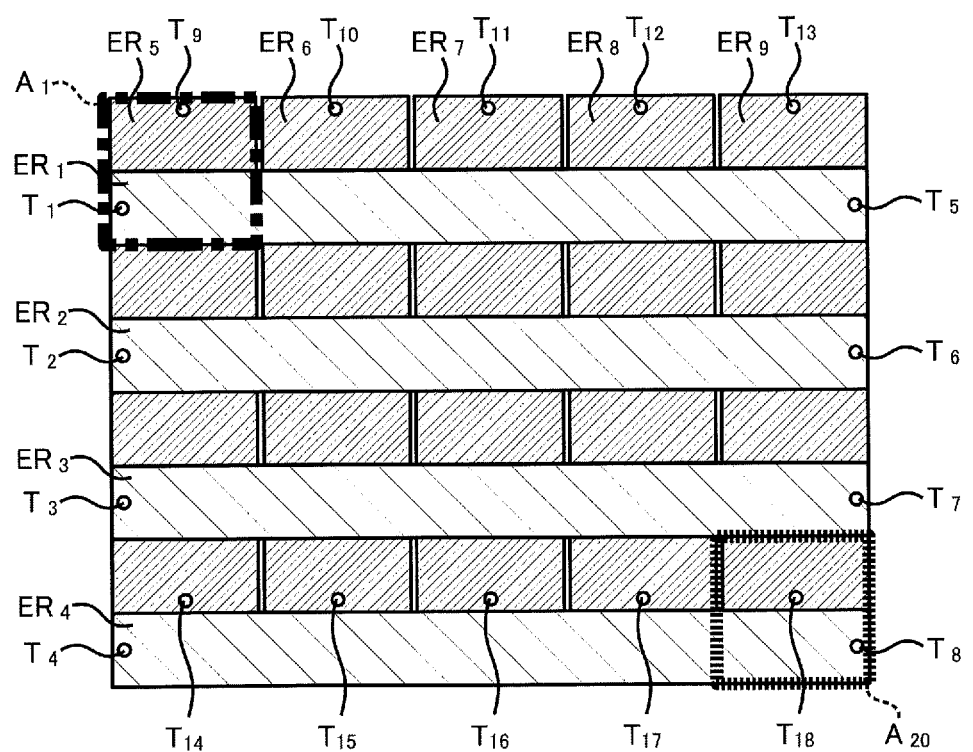
FIG. 17B is a drawing illustrating a pattern of electrodes overlapping the sections according to the third embodiment.
Figure 18A:
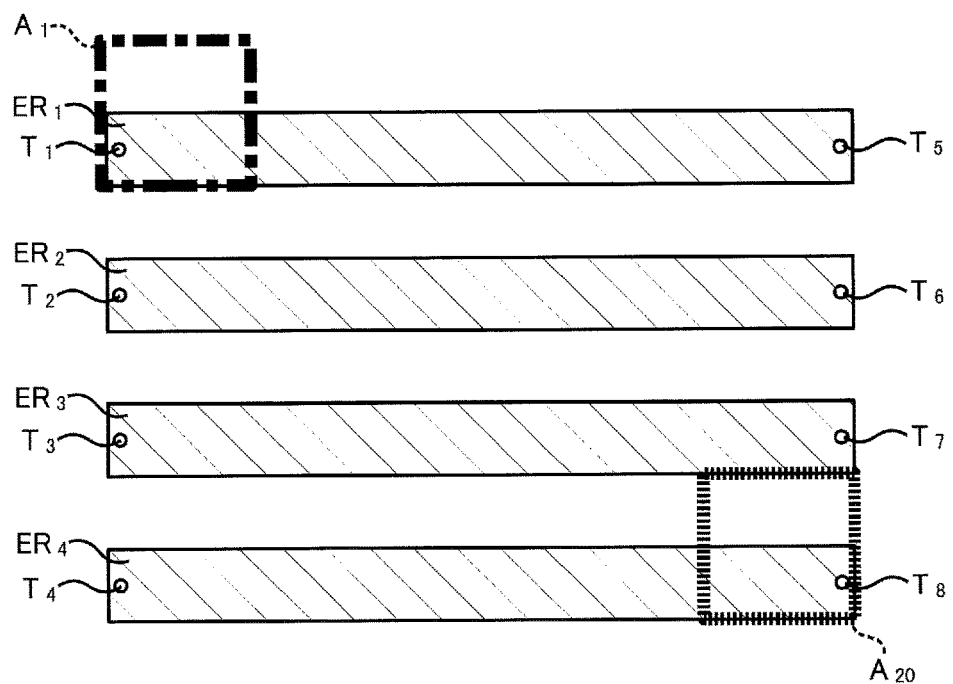
FIG. 18A is a drawing illustrating a pattern of electrodes formed in an upper layer.
Figure 18B:
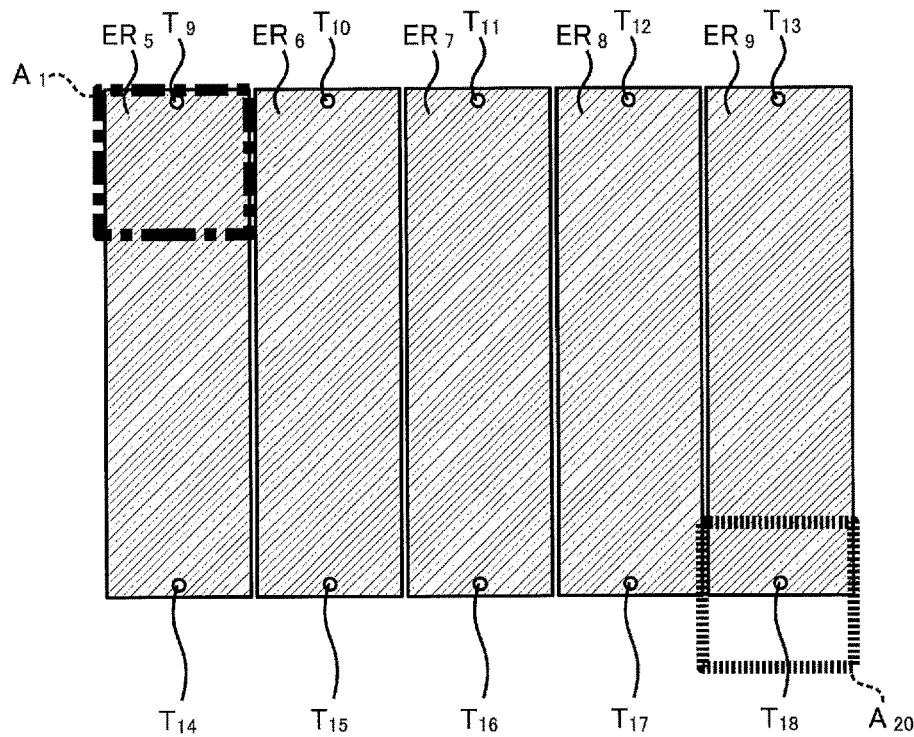
FIG. 18B is a drawing illustrating a pattern of electrodes formed in a lower layer.

FIGS. 17A and 17B illustrate a pattern of electrodes in the input device of the third embodiment. FIG. 17A illustrates 20 sections ($A_1$ through $A_{20}$) on the operation surface 11, and FIG. 17B illustrates a pattern of 9 electrodes ($ER_1$ through $ER_9$) overlapping the sections A. FIGS. 18A and 18B illustrate details of the pattern of electrodes ($ER_1$ through $ER_9$) illustrated in FIG. 17B. FIG. 18A illustrates a pattern of 4 electrodes ($ER_1$ through $ER_4$) formed in an upper layer, and FIG. 18B illustrates a pattern of 5 electrodes ($ER_5$ through $ER_9$) formed in a lower layer.

Figure 20:
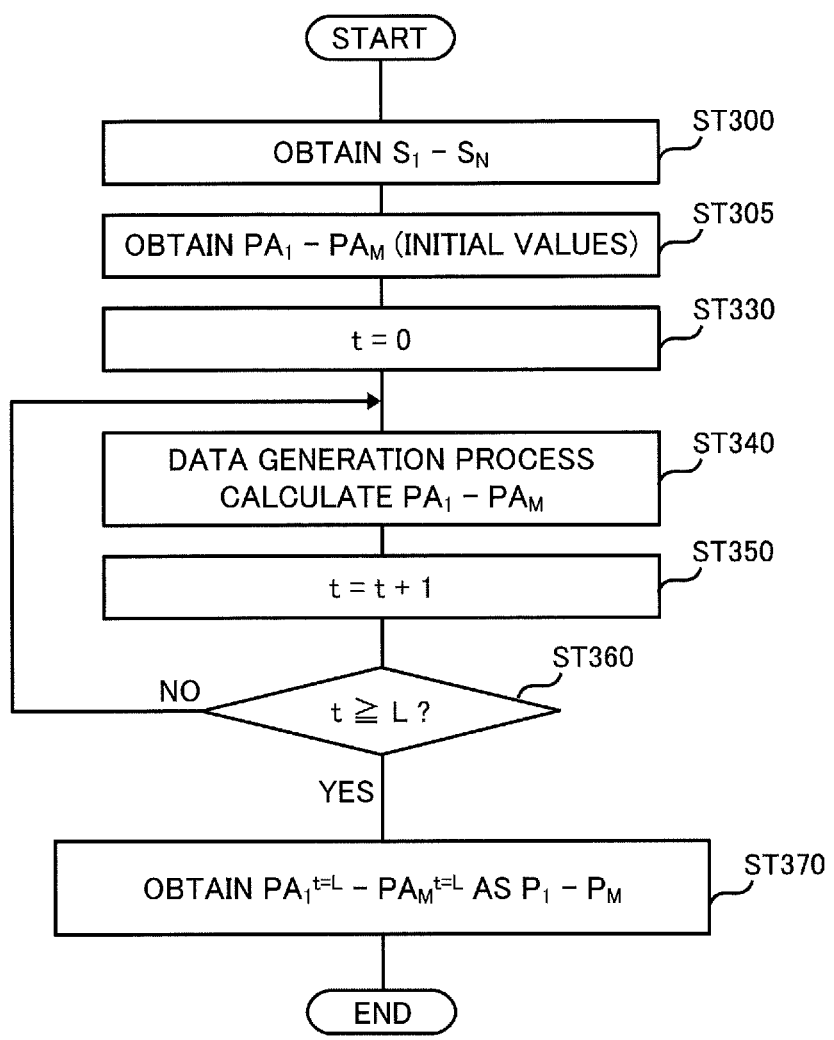
FIG. 20 is a flowchart illustrating another variation of the process of generating M sets of element data based on N sets of detection data.

Similarly to FIG. 12A, 20 sections $A_1$ through $A_{20}$ in FIG. 17A form a 4×5 grid pattern.

In the example of FIG. 18A, the electrodes $ER_1$ through $ER_4$ are disposed in the first through fourth rows of the grid pattern in this order, and each of the electrodes $ER_1$ through $ER_4$ extends from the first column to the fifth column. Specifically, ½ of the area of each section is occupied by the corresponding one of the electrodes $ER_1$ through $ER_4$. Terminals $T_1$ through $T_4$ are provided at the first-column-side ends of the electrodes $ER_1$ through $ER_4$, and terminals $T_5$ through $T_8$ are provided at the fifth-column-side ends of the electrodes $ER_1$ through $ER_4$.

In the example of FIG. 18B, the electrodes $E_5$ through $E_9$ are disposed in the first through fifth columns of the grid pattern in this order and extend from the first row to the fourth row. Specifically, ½ of the area of each section is occupied by the corresponding one of the electrodes $ER_5$ through $ER_9$. Terminals $T_9$ through $T_{13}$ are provided at the first-row-side ends of the electrodes $ER_5$ through $ER_9$, and terminals $T_{14}$ through $T_{18}$ are provided at the fourth-row-side ends of the electrodes $ER_5$ through $ER_9$.

The terminal $T_1$ of the electrode $ER_1$ is taken as an example. The terminal $T_1$ is directly connected to an overlapping portion $ER_{11}$ where the electrode $ER_1$ overlaps the section $A_1$. Accordingly, the entirety of partial charge $QP_{11}$ stored in the overlapping portion $ER_{11}$ approximates to the charge distributed to the terminal $T_1$. Also, according to the proportion of the area occupied by the overlapping portion $ER_{11}$ in the section $A_1$, the partial charge $QP_{11}$ is ½ of the combined charge $Q_1$. Therefore, constant data $K_{11}$ for the electrode $ER_1$ in the section $A_1$ is ½.

An overlapping portion $ER_{12}$ where the electrode $ER_1$ overlaps the section $A_2$ is connected to the terminal $T_1$ via one section and is also connected to the terminal $T_5$ via three sections. Accordingly, ¾ of partial charge $QP_{12}$ stored in the overlapping portion $ER_{12}$ approximates to the charge distributed to the terminal $T_1$, and ¼ of the partial charge $QP_{12}$ approximates to the charge distributed to the terminal $T_5$. Also, according to the proportion of the area occupied by the overlapping portion $ER_{12}$ in the section $A_2$, the partial charge $QP_{12}$ is ½ of the combined charge $Q_2$. Therefore, constant data $K_{12}$ for the electrode $ER_1$ in the section $A_2$ is ⅜.

An overlapping portion $ER_{13}$ where the electrode $ER_1$ overlaps the section $A_3$ is connected to the terminal $T_1$ via two sections and is also connected to the terminal $T_5$ via two sections. Accordingly, ½ of partial charge $QP_{13}$ stored in the overlapping portion $ER_{13}$ approximates to the charge distributed to the terminal $T_1$, and ½ of the partial charge $QP_{13}$ approximates to the charge distributed to the terminal $T_5$. Also, according to the proportion of the area occupied by the overlapping portion $ER_{13}$ in the section $A_3$, the partial charge $QP_{13}$ is ½ of the combined charge $Q_3$. Therefore, constant data $K_{13}$ for the electrode $ER_1$ in the section $A_3$ is ¼.

An overlapping portion $ER_{14}$ where the electrode $ER_1$ overlaps the section $A_4$ is connected to the terminal $T_1$ via three sections and is also connected to the terminal $T_5$ via one section. Accordingly, ¼ of partial charge $QP_{14}$ stored in the overlapping portion $ER_{14}$ approximates to the charge distributed to the terminal $T_1$, and ¾ of the partial charge $QP_{14}$ approximates to the charge distributed to the terminal $T_5$. Also, according to the proportion of the area occupied by the overlapping portion $ER_{14}$ in the section $A_4$, the partial charge $QP_{14}$ is ½ of the combined charge $Q_4$. Therefore, constant data $K_{14}$ for the electrode $ER_1$ in the section $A_4$ is ⅛.

An overlapping portion $ER_{15}$ where the electrode $ER_1$ overlaps the section $A_5$ is directly connected to the terminal $T_5$. Accordingly, the entirety of partial charge $QP_{15}$ stored in the overlapping portion $ER_{15}$ approximates to the charge distributed to the terminal $T_5$. Therefore, constant data $K_{15}$ for the electrode $ER_1$ in the section $A_5$ is zero.

In short, the constant data K11, K12, K13, K14, and K15 become ½, ⅜, ¼, ⅛, and 0, respectively. Through similar calculations, the first conversion matrix K including 18×20 sets of constant data $K_{ij}$ can be obtained. The first conversion matrix K is represented by formula (22).

As described above, similarly to the first embodiment, the third embodiment also makes it possible to generate, though simplified calculations, multiple sets of element data P whose number is greater than the number of sets of detection data S.

Also in the third embodiment, because multiple terminals T are provided on each electrode ER and one set of detection data S is generated for each terminal T, the number of electrodes ER becomes less than the number of sets of detection data S. This in turn makes it possible to further simplify the configuration of the sensor 10B.

The present invention is not limited to the above-described embodiments, and may include variations of the embodiments.

In the above embodiments, fixed values are used as initial values for the data generation process that is performed repeatedly. However, the present invention is not limited to this example.

Figure 19:
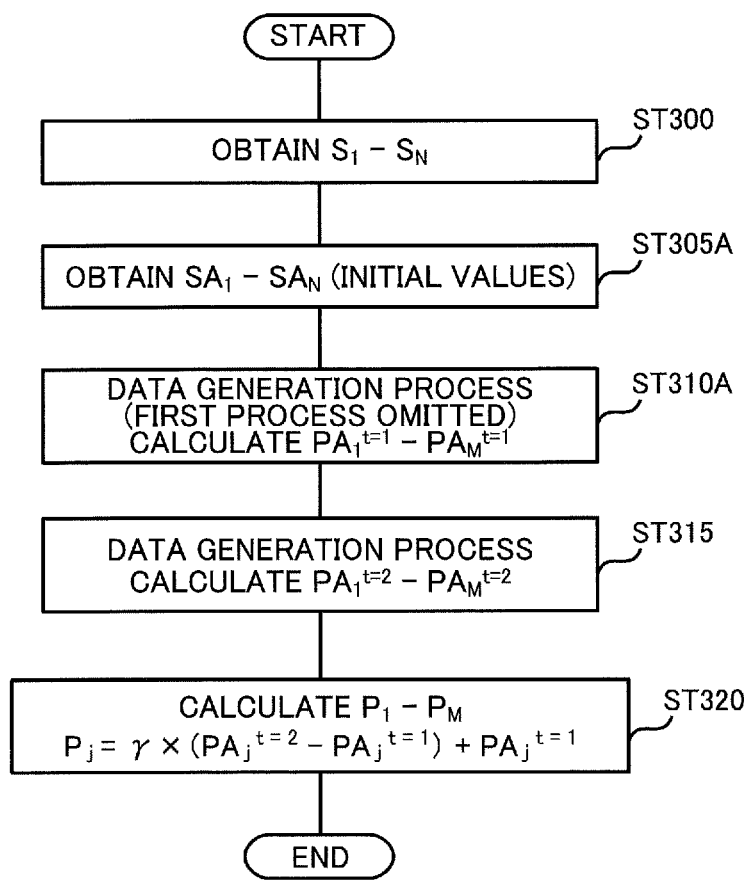
FIG. 19 is a flowchart illustrating a variation of the process of generating M sets of element data based on N sets of detection data.

FIG. 19 is a flowchart illustrating a variation of the process of generating M sets of element data P based on N sets of detection data S.

Figure 8:
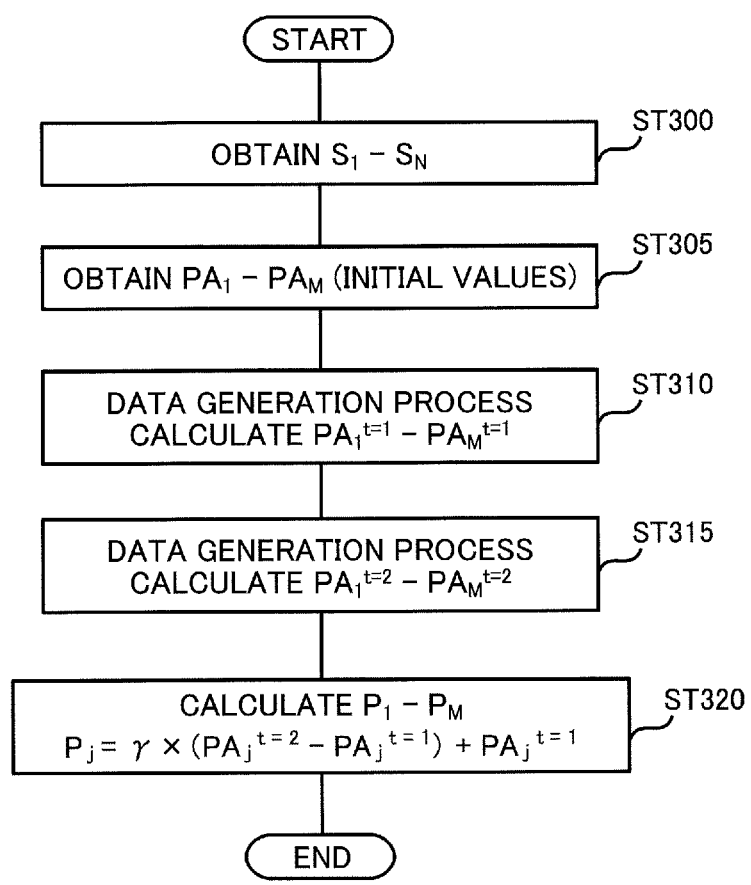
FIG. 8 is a flowchart illustrating a process of generating M sets of element data based on N sets of detection data.

In the first data generation process (ST310) in the flowchart of FIG. 8, tentative values $SA_1$ through $SA_N$ of detection data are calculated by using tentative values $PA_1$ through $PA_M$ of element data obtained at step ST305 as initial values. However, because this calculation result is constant regardless of detection data $S_1$ through $S_N$, it is not necessary to perform this calculation each time element data $P_1$ through $P_M$ are generated. For the above reason, in the flowchart of FIG. 19 according to a variation, the step (first process) of calculating tentative values $SA_1$ through $SA_N$ of detection data is omitted in the first data generation process (ST310A).

That is, instead of performing the step (first process) of calculating tentative values $SA_1$ through $SA_N$ of detection data in the first data generation process (ST310A), the element data generator 22 obtains the tentative values $SA_1$ through $SA_N$ of detection data from, for example, the storage 30 (ST305A). In the second data generation process (ST315), the element data generator 22 calculates tentative values $SA_1$ through $SA_N$ of detection data (first process) based on tentative values $PA_1$ through $PA_M$ of element data corrected in the previous data generation process (ST310A).

Omitting the step (first process) of calculating tentative values $SA_1$ through $SA_N$ of detection data in the first data generation process (ST310A) makes it possible to improve the processing speed.

FIG. 20 is a flowchart illustrating another variation of the process of generating M sets of element data P based on N sets of detection data S.

In the above embodiments, values obtained by repeating a data generation process a large number of times are estimated by repeating a data generation process two times. With this method, however, errors may become large when, for example, the values of detection data are small. In such a case, the data generation process may be repeated a large number of times (L times) according to the flowchart of FIG. 20 to improve the accuracy of final values of element data $P_1$ through $P_M$. Steps ST300 through ST360 in the flowchart of FIG. 20 are the same as steps ST200 through ST245 in the flowchart of FIG. 7. The element data generator 22 obtains tentative values $PA_1$ through $PA_M$ of element data obtained in the L-th data generation process as the final values of element data $P_1$ through $P_M$ (ST370).

A first aspect of the present invention relates to an input device for inputting information corresponding to the proximity of an object to an operation surface. The input device includes a sensor that detects the degree of proximity of the object in each of one or more detection regions on the operation surface, generates one or more sets of detection data corresponding to the detection result for each of the detection regions, and thereby generates N sets of the detection data in total; and an element data generator that generates, based on the N sets of the detection data, M (M is a natural number greater than N) sets of element data indicating degrees of proximity of the object in M sections that virtually divide the operation surface. Each of the M sections includes overlapping portions overlapping one or more of the detection regions. Each of the M sets of the element data is a sum of sets of subelement data distributed to the N sets of the detection data according to predetermined percentages; and each of the N sets of the detection data approximates to a sum of sets of the subelement data distributed from the M sets of the element data according to the predetermined percentages. The element data generator repeats a data generation process at least two times. The data generation process includes calculating each of tentative values of the N sets of the detection data by totaling the sets of the subelement data distributed from tentative values of the M sets of the element data according to the predetermined percentages, and correcting the tentative values of the M sets of the element data based on N predetermined percentages set for each of the M sets of the element data such that the calculated tentative values of the N sets of the detection data become closer to the N sets of the detection data. Also, the element data generator calculates, for each of the M sections, a value that is approximate to a convergence value of the element data obtained by the repetition of the data generation process, by obtaining a difference between a first tentative value of the element data obtained in a first execution of the data generation process and a second tentative value of the element data obtained in a second execution of the data generation process, multiplying the difference by a predetermined proportionality coefficient, and adding the multiplied difference to the first tentative value.

With this configuration, each of the M sections virtually dividing the operation surface includes overlapping portions overlapping one or more of the detection regions, and the sensor generates one or more sets of detection data for each of the detection regions. Accordingly, the sensor generates one or more sets of detection data indicating the degree of proximity of the object for each of the M sections.

Each of the M sets of the element data is a sum of sets of subelement data distributed to the N sets of the detection data according to predetermined percentages, and each of the N sets of the detection data approximates to a sum of sets of the subelement data distributed from the M sets of the element data according to the predetermined percentages. Thus, the conversion of M sets of element data into N sets of detection data is defined by N predetermined percentages set for each of M sets of element data.

In the data generation process, each of the tentative values of the N sets of the detection data is calculated as a sum of sets of the subelement data distributed from the M sets of the element data according to the predetermined percentages. Also, the tentative values of the M sets of element data are corrected based on N predetermined percentages set for each of the M sets of element data such that the calculated tentative values of the N sets of detection data become closer to the N sets of detection data. Convergence values of element data conforming to the N sets of detection data can be obtained by repeating the data generation process a large number of times.

However, the element data generator is configured to repeat the data generation process at least two times, and to calculate, for each of the M sections, a value that is approximate to a convergence value of the element data by obtaining a difference between a first tentative value of the element data obtained in a first execution of the data generation process and a second tentative value of the element data obtained in a second execution of the data generation process, multiplying the difference by a predetermined proportionality coefficient, and adding the multiplied difference to the first tentative value. Compared with a configuration where the data generation process is repeated a large number of times to obtain convergence values of element data, the above configuration makes it possible to simplify the calculations.

Preferably, the data generation process may include a first process of converting the tentative values of the M sets of the element data into the tentative values of the N sets of the detection data based on the N predetermined percentages set for each of the M sets of the element data; a second process of calculating N first coefficients used to multiply the tentative values of the N sets of the detection data to make the tentative values of the N sets of the detection data equal to the N sets of the detection data; a third process of converting the N first coefficients into M second coefficients used to multiply the M sets of the element data based on the N predetermined percentages set for each of the M sets of the element data; and a fourth process of correcting the tentative values of the M sets of the element data based on the M second coefficients.

Preferably, in the first process, the element data generator may convert a matrix composed of the tentative values of the M sets of the element data into a matrix composed of the tentative values of the N sets of the detection data based on a first conversion matrix that is composed of M×N components corresponding to the M sets of the element data and the N sets of the detection data, each of the components of the first conversion matrix indicating a predetermined percentage of the subelement data distributed from one set of the element data to one set of the detection data.

Preferably, in the third process, the element data generator may convert a matrix composed of the N first coefficients into a matrix composed of the M second coefficients based on a second conversion matrix that is composed of M×N components corresponding to the M sets of the element data and the N sets of the detection data, each of the components of the second conversion matrix indicating a predetermined percentage of the subelement data distributed from one set of the element data to one set of the detection data.

Preferably, in the first execution of the data generation process, the element data generator may omit the first process and perform the second process using predetermined N initial values as the tentative values of the N sets of the detection data.

Omitting the first process can improve the processing speed.

Preferably, in the first execution of the data generation process, the element data generator may perform the first process by using, as the tentative values of the M sets of the element data, M initial values that are based on at least one group of most-recently-generated M sets of element data.

Performing the first process using the initial values based on most-recently-generated element data makes it possible to improve the accuracy of the M sets of element data to be generated.

Preferably, the sensor may include N electrodes formed in the different detection regions, and a capacitance detector that generates, for each of the N electrodes, detection data corresponding to first capacitance between the object in proximity to the operation surface and the each of the N electrodes. One set of the subelement data may be approximate to second capacitance between the object and an overlapping portion of one of the N electrodes in one of the sections; and one set of the element data may be approximate to third capacitance obtained by combining all values of the second capacitance in one of the sections.

In this case, each of the predetermined percentages may correspond to an area ratio of the overlapping portion of one of the electrodes in one of the sections to the overlapping portions of all of the electrodes in the one of the sections.

The above configuration makes it possible to generate element data corresponding to the capacitance between the object and overlapping portions of one or more of the electrodes in each of the M sections on the operation surface.

Preferably, the sensor may include multiple electrodes formed in the different detection regions, each of the electrodes including multiple terminals, and the electrodes including N terminals in total; and a capacitance detector that receives charges stored between the object in proximity to the operation surface and the electrodes from the respective N terminals and based on the received charges, generates detection data corresponding to capacitance between the object and the electrodes for the respective N terminals. The capacitance detector may receive the charge stored in each of the electrodes simultaneously from the multiple terminals provided on the each of the electrodes. As a result of the simultaneous receiving, a partial charge stored between the object and the overlapping portion of one of the electrodes in one of the sections may be distributed as distributed charges to the multiple terminals based on conductance between the overlapping portion and the respective terminals. One set of the subelement data may approximate to the distributed charge distributed to one of the terminals by the simultaneous receiving. One set of the element data may approximate to a combined charge obtained by combining all partial charges stored in the all overlapping portions of the electrodes in the one of the sections.

In this case, each of the predetermined percentages may correspond to an area ratio of the overlapping portion of one of the electrodes in one of the sections to all of the overlapping portions of the electrodes in the one of the sections, and a ratio of conductance between one of the terminals and the overlapping portion in the one of the electrodes to conductance between all of the terminals to the overlapping portion in the one of the electrodes.

The above configuration makes it possible to generate element data corresponding to the capacitance between the object and overlapping portions of one or more of the electrodes in each of the M sections on the operation surface. Also, because multiple terminals are provided on each electrode and one set of detection data is generated for each of the terminals, the number of the electrodes becomes less than the number of sets of generated detection data, and the configuration of the sensor is simplified.

A second aspect of the present invention relates to an element data generation method performed by an input device including a sensor that detects a degree of proximity of an object in each of multiple detection regions on an operation surface and generates N sets of detection data corresponding to the detection result. The element data generation method includes generating, based on the N sets of the detection data, M (M is a natural number greater than N) sets of element data indicating degrees of proximity of the object in M sections that virtually divide the operation surface. Each of the M sections includes overlapping portions overlapping one or more of the detection regions. Each of the M sets of the element data is a sum of sets of subelement data distributed to the N sets of the detection data according to predetermined percentages; and each of the N sets of the detection data approximates to a sum of sets of the subelement data distributed from the M sets of the element data according to the predetermined percentages. The element data generation method further includes repeating a data generation process at least two times, the data generation process including calculating each of tentative values of the N sets of the detection data by totaling the sets of the subelement data distributed from tentative values of the M sets of the element data according to the predetermined percentages, and correcting the tentative values of the M sets of the element data based on N predetermined percentages set for each of the M sets of the element data such that the calculated tentative values of the N sets of the detection data become closer to the N sets of the detection data; and calculating, for each of the M sections, a value that is approximate to a convergence value of the element data obtained by the repetition of the data generation process by obtaining a difference between a first tentative value of the element data obtained in a first execution of the data generation process and a second tentative value of the element data obtained in a second execution of the data generation process, multiplying the difference by a predetermined proportionality coefficient, and adding the multiplied difference to the first tentative value.

Preferably, the data generation process may include converting the tentative values of the M sets of the element data into the tentative values of the N sets of the detection data based on the N predetermined percentages set for each of the M sets of the element data; calculating N first coefficients used to multiply the tentative values of the N sets of the detection data to make the tentative values of the N sets of the detection data equal to the N sets of the detection data; converting the N first coefficients into M second coefficients used to multiply the M sets of the element data based on the N predetermined percentages set for each of the M sets of the element data; and correcting the tentative values of the M sets of the element data based on the M second coefficients.

A third aspect of the present invention provides a non-transitory computer-readable storage medium storing a program for causing a computer to execute the element data generation method according to the second aspect.

The present invention makes it possible to generate element data indicating the degree of proximity of an object in each of multiple sections on an operation surface by simple calculations based on sets of detection data whose number is smaller than the number of the sections.

An input device, an element data generation method, and a storage medium according to embodiments are described above. However, the present invention is not limited to the specifically disclosed embodiments, and variations and modifications may be made without departing from the scope of the present invention.

What is claimed is:

1. An input device that inputs information corresponding to proximity of an object to an operation surface, the input device comprising:
   a sensor that detects a degree of proximity of the object in each of one or more detection regions on the operation surface, generates one or more sets of detection data corresponding to the detection result for each of the detection regions, and thereby generates N sets of the detection data in total; and
   an element data generator that generates, based on the N sets of the detection data, M (M is a natural number greater than N) sets of element data indicating degrees of proximity of the object in M sections that virtually divide the operation surface, wherein
   each of the M sections includes overlapping portions overlapping one or more of the detection regions;
   each of the M sets of the element data is a sum of sets of subelement data distributed to the N sets of the detection data according to predetermined percentages;
   each of the N sets of the detection data approximates to a sum of sets of the subelement data distributed from the M sets of the element data according to the predetermined percentages; and the element data generator is configured to
repeat a data generation process at least two times, the data generation process including calculating each of tentative values of the N sets of the detection data by totaling the sets of the subelement data distributed from tentative values of the M sets of the element data according to the predetermined percentages, and correcting the tentative values of the M sets of the element data based on N predetermined percentages set for each of the M sets of the element data such that the calculated tentative values of the N sets of the detection data become closer to the N sets of the detection data, and
calculate, for each of the M sections, a value that is approximate to a convergence value of the element data obtained by the repetition of the data generation process, by obtaining a difference between a first tentative value of the element data obtained in a first execution of the data generation process and a second tentative value of the element data obtained in a second execution of the data generation process, multiplying the difference by a predetermined proportionality coefficient, and adding the multiplied difference to the first tentative value.

2. The input device as claimed in claim 1, wherein the data generation process includes
a first process of converting the tentative values of the M sets of the element data into the tentative values of the N sets of the detection data based on the N predetermined percentages set for each of the M sets of the element data;
a second process of calculating N first coefficients used to multiply the tentative values of the N sets of the detection data to make the tentative values of the N sets of the detection data equal to the N sets of the detection data;
a third process of converting the N first coefficients into M second coefficients used to multiply the M sets of the element data based on the N predetermined percentages set for each of the M sets of the element data; and
a fourth process of correcting the tentative values of the M sets of the element data based on the M second coefficients.

3. The input device as claimed in claim 2, wherein in the first process, the element data generator converts a matrix composed of the tentative values of the M sets of the element data into a matrix composed of the tentative values of the N sets of the detection data based on a first conversion matrix that is composed of M×N components corresponding to the M sets of the element data and the N sets of the detection data, each of the components of the first conversion matrix indicating a predetermined percentage of the subelement data distributed from one set of the element data to one set of the detection data.

4. The input device as claimed in claim 2, wherein in the third process, the element data generator converts a matrix composed of the N first coefficients into a matrix composed of the M second coefficients based on a second conversion matrix that is composed of M×N components corresponding to the M sets of the element data and the N sets of the detection data, each of the components of the second conversion matrix indicating a predetermined percentage of the subelement data distributed from one set of the element data to one set of the detection data.

5. The input device as claimed in claim 2, wherein in the first execution of the data generation process, the element data generator omits the first process and performs the second process using predetermined N initial values as the tentative values of the N sets of the detection data.

6. The input device as claimed in claim 2, wherein in the first execution of the data generation process, the element data generator performs the first process by using, as the tentative values of the M sets of the element data, M initial values that are based on at least one group of most-recently-generated M sets of element data.

7. The input device as claimed in claim 1, wherein
the sensor includes
N electrodes formed in the different detection regions, and
a capacitance detector that generates, for each of the N electrodes, detection data corresponding to first capacitance between the object in proximity to the operation surface and the each of the N electrodes;
one set of the subelement data approximates to second capacitance between the object and an overlapping portion of one of the N electrodes in one of the sections; and
one set of the element data approximates to third capacitance obtained by combining all values of the second capacitance in one of the sections.

8. The input device as claimed in claim 7, wherein each of the predetermined percentages corresponds to an area ratio of the overlapping portion of one of the electrodes in one of the sections to the overlapping portions of all of the electrodes in the one of the sections.

9. The input device as claimed in claim 1, wherein
the sensor includes
multiple electrodes formed in the different detection regions, each of the electrodes including multiple terminals, and the electrodes including N terminals in total, and
a capacitance detector that receives charges stored between the object in proximity to the operation surface and the electrodes from the respective N terminals and based on the received charges, generates detection data corresponding to capacitance between the object and the electrodes for the respective N terminals;
the capacitance detector receives the charge stored in each of the electrodes simultaneously from the multiple terminals provided on the each of the electrodes;
as a result of the simultaneous receiving, a partial charge stored between the object and the overlapping portion of one of the electrodes in one of the sections is distributed as distributed charges to the multiple terminals based on conductance between the overlapping portion and the respective terminals;
one set of the subelement data approximates to the distributed charge distributed to one of the terminals by the simultaneous receiving; and
one set of the element data approximates to a combined charge obtained by combining all partial charges stored in the all overlapping portions of the electrodes in the one of the sections.

10. The input device as claimed in claim 9, wherein each of the predetermined percentages corresponds to
an area ratio of the overlapping portion of one of the electrodes in one of the sections to all of the overlapping portions of the electrodes in the one of the sections, and
a ratio of conductance between one of the terminals and the overlapping portion in the one of the electrodes to conductance between all of the terminals to the overlapping portion in the one of the electrodes.

11. An element data generation method performed by an input device including a sensor that detects a degree of proximity of an object in each of multiple detection regions on an operation surface and generates N sets of detection data corresponding to the detection result, the element data generation method comprising:

generating, based on the N sets of the detection data, M (M is a natural number greater than N) sets of element data indicating degrees of proximity of the object in M sections that virtually divide the operation surface, wherein each of the M sections includes overlapping portions overlapping one or more of the detection regions;

each of the M sets of the element data is a sum of sets of subelement data distributed to the N sets of the detection data according to predetermined percentages;

each of the N sets of the detection data approximates to a sum of sets of the subelement data distributed from the M sets of the element data according to the predetermined percentages; and the element data generation method further includes
repeating a data generation process at least two times, the data generation process including calculating each of tentative values of the N sets of the detection data by totaling the sets of the subelement data distributed from tentative values of the M sets of the element data according to the predetermined percentages, and correcting the tentative values of the M sets of the element data based on N predetermined percentages set for each of the M sets of the element data such that the calculated tentative values of the N sets of the detection data become closer to the N sets of the detection data, and calculating, for each of the M sections, a value that is approximate to a convergence value of the element data obtained by the repetition of the data generation process by obtaining a difference between a first tentative value of the element data obtained in a first execution of the data generation process and a second tentative value of the element data obtained in a second execution of the data generation process, multiplying the difference by a predetermined proportionality coefficient, and adding the multiplied difference to the first tentative value.

12. The element data generation method as claimed in claim 11, wherein the data generation process includes
converting the tentative values of the M sets of the element data into the tentative values of the N sets of the detection data based on the N predetermined percentages set for each of the M sets of the element data;

calculating N first coefficients used to multiply the tentative values of the N sets of the detection data to make the tentative values of the N sets of the detection data equal to the N sets of the detection data;

converting the N first coefficients into M second coefficients used to multiply the M sets of the element data based on the N predetermined percentages set for each of the M sets of the element data; and correcting the tentative values of the M sets of the element data based on the M second coefficients.

13. A non-transitory computer-readable storage medium storing a program for causing a computer to execute the element data generation method as claimed in claim 11.

* * * * *